（12） United States Patent
Park

(10) Patent No.: US 10,741,570 B2
(45) Date of Patent: Aug. 11, 2020

(54) NONVOLATILE MEMORY DEVICES HAVING SINGLE-LAYERED GATES AND METHODS OF FABRICATING THE SAME

(71) Applicant: SK hynix Inc., Gyeonggi-do (KR)

(72) Inventor: Sung Kun Park, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 268 days.

(21) Appl. No.: 15/399,471

(22) Filed: Jan. 5, 2017

(65) Prior Publication Data

US 2017/0117287 A1 Apr. 27, 2017

Related U.S. Application Data

(63) Continuation of application No. 14/710,287, filed on May 12, 2015, now abandoned.

(30) Foreign Application Priority Data

Jan. 21, 2015 (KR) .................. 10-2015-0010246

(51) Int. Cl.
*H01L 27/11548* (2017.01)
*H01L 29/66* (2006.01)
(Continued)

(52) U.S. Cl.
CPC .. *H01L 27/11548* (2013.01); *H01L 21/76897* (2013.01); *H01L 23/5223* (2013.01); *H01L 27/11521* (2013.01); *H01L 27/11556* (2013.01); *H01L 29/40114* (2019.08); *H01L 29/42328* (2013.01); *H01L 29/45* (2013.01); *H01L 29/66825* (2013.01); *H01L 29/7885* (2013.01);
(Continued)

(58) Field of Classification Search
CPC ......... H01L 27/11548; H01L 27/11521; H01L 27/11519; H01L 29/40114; H01L 29/42328; H01L 29/45; H01L 29/66825; H01L 29/7885
See application file for complete search history.

(56) References Cited

U.S. PATENT DOCUMENTS

2007/0023822 A1 2/2007 Sung et al.
2012/0164831 A1* 6/2012 Kim .................. H01L 21/76807
438/675

FOREIGN PATENT DOCUMENTS

CN 102376719 A 3/2012

OTHER PUBLICATIONS

Office Action issued by Chinese Patent Office dated Dec. 26, 2019.

* cited by examiner

*Primary Examiner* — Sue A Purvis
*Assistant Examiner* — Scott Stowe
(74) *Attorney, Agent, or Firm* — IP & T Group LLP

(57) ABSTRACT

A nonvolatile memory device includes an active region extending in a first direction and including a source region and a drain region that are respectively disposed at both ends of the active region, a gate electrode pattern extending in a second direction and disposed between the source region and the drain region, wherein the second direction extends across the first direction, a gate insulation pattern disposed between the gate electrode pattern and the active region, a source contact plug and a drain contact plug respectively coupled to the source region and the drain region, and a coupling contact plug disposed over the gate electrode pattern and insulated from the gate electrode pattern.

6 Claims, 18 Drawing Sheets

(51) Int. Cl.
*H01L 21/768* (2006.01)
*H01L 21/28* (2006.01)
*H01L 29/423* (2006.01)
*H01L 29/788* (2006.01)
*H01L 23/522* (2006.01)
*H01L 27/11521* (2017.01)
*H01L 27/11556* (2017.01)
*H01L 29/45* (2006.01)
*H01L 21/285* (2006.01)

(52) U.S. Cl.
CPC .. *H01L 21/28518* (2013.01); *H01L 21/76816* (2013.01); *H01L 21/76832* (2013.01); *H01L 21/76834* (2013.01); *H01L 2924/0002* (2013.01)

NONVOLATILE MEMORY DEVICES HAVING SINGLE-LAYERED GATES AND METHODS OF FABRICATING THE SAME

CROSS-REFERENCE TO RELATED APPLICATIONS

This application is a continuation of U.S. patent application Ser. No. 14/710,287 filed on May 12, 2015, which claims priority under 35 U.S.C. 119(a) to Korean Patent Application No. 10-2015-0010246, filed on Jan. 21, 2015, in the Korean Intellectual Property Office. The disclosure of each of the foregoing application is incorporated herein by reference in its entirety.

BACKGROUND

1. Technical Field

Various embodiments of the present disclosure relate to nonvolatile memory devices and methods of fabricating the same and, more particularly, to nonvolatile memory device having single-layered gates and methods of fabricating the same.

2. Related Art

Electrically erasable programmable read only memory (EEPROM) devices and flash memory devices are nonvolatile memory devices that retain their stored data even when their power supplies are interrupted. Various memory cell structures of the nonvolatile memory devices have been proposed to improve their performance. A typical unit memory cell of the nonvolatile memory devices employs a stack gate structure including a floating gate, an inter-gate dielectric layer and a control gate which are sequentially stacked on a semiconductor substrate. As electronic systems become smaller with the development of fabrication techniques of semiconductor devices, system-on-chip (SOC) products have been revealed and utilized as important devices of high performance digital systems. Each of the SOC products may include a plurality of semiconductor devices executing various functions in a single chip. For example, the SOC product may include at least one logic device and at least one memory device which are integrated in a single chip. Thus, fabrication technologies of embedded nonvolatile memory devices may be required to embed the nonvolatile memory devices in the SOC products.

To embed the nonvolatile memory devices in the SOC products, the process technology of the nonvolatile memory devices has to be compatible with the process technology of the logic device included in the SOC products. In general, the logic devices employ transistors having a single gate structure, whereas the nonvolatile memory devices employ cell transistors having a stack gate structure that is, a double gate structure. Thus, the SOC products including the nonvolatile memory devices and the logic devices may require a complicate process technology. Accordingly, single-layered gate nonvolatile memory devices employing a single-layered gate cell structure are very attractive as a candidate of the embedded nonvolatile memory devices. That is, complementary metal-oxide-semiconductor (CMOS) circuits of the logic devices may be readily realized using a process technology of the single-layered gate nonvolatile memory devices. As a result, the process technology of the single-layered gate nonvolatile memory devices may be widely used in fabrication of the SOC products including the embedded nonvolatile memory devices.

SUMMARY

Various embodiments are directed to nonvolatile memory device having single-layered polysilicon gates and methods of fabricating the same.

According to an embodiment, there is provided a nonvolatile memory device. The nonvolatile memory device includes an active region extending in a first direction and including a source region and a drain region that are respectively disposed at both ends of the active region, a gate electrode pattern extending in a second direction and disposed between the source region and the drain region, wherein the second direction extends across the first direction, a gate insulation pattern disposed between the gate electrode pattern and the active region, a source contact plug and a drain contact plug respectively coupled to the source region and the drain region, and a coupling contact plug disposed over the gate electrode pattern and insulated from the gate electrode pattern.

According to another embodiment, there is provided a nonvolatile memory device. The nonvolatile memory device includes a source region and a drain region disposed in a substrate and spaced apart from each other, a first silicide layer and a second silicide layer respectively disposed over the source region and the drain region, a gate insulation pattern disposed over a channel region and between the source region and the drain region, a gate electrode pattern disposed over the gate insulation pattern, an insulation spacer disposed over sidewalls of the gate electrode pattern and the gate insulation pattern, a silicide blocking layer covering the insulation spacer and the gate electrode pattern and having a multi-layered structure, an etch buffer layer disposed over the silicide blocking layer and the first and second silicide layers, an interlayer insulation layer disposed over the etch buffer layer, a source contact plug and a drain contact plug penetrating the interlayer insulation layer to respectively contact the first silicide layer and the second silicide layer, and a coupling contact plug penetrating the interlayer insulation layer and the etch buffer layer and extending to the silicide blocking layer.

According to another embodiment, there is provided a nonvolatile memory device including a plurality of active regions respectively extending in the plurality of rows, a plurality of gate electrode patterns respectively disposed at cross points of a plurality of rows and a plurality of columns and extending across the active regions, source regions and drain regions disposed in the active region and located at both sides of each of the gate electrode patterns, source contact plugs respectively disposed over the source regions, drain contact plugs respectively disposed over the drain regions, a plurality of coupling contact plugs respectively extending in the plurality of columns, each of the coupling contact plugs overlapping with the gate electrode patterns, and an insulation layer disposed between the coupling contact plugs and the gate electrode patterns.

According to another embodiment, there is provided a nonvolatile memory device. The nonvolatile memory device includes an active region extending in a first direction, a storage gate extending across a first region of the active region and insulated from the active region by a first gate insulation layer, a selection gate extending across a second region of the active region and insulated from the active region by a second gate insulation layer, a first junction region disposed in a first end of the active region that is adjacent to a sidewall of the storage gate, a second junction region disposed in a second end of the active region that is adjacent to a sidewall of the selection gate, wherein second end is located opposite to the storage gate in the first direction, a first contact and a second contact respectively disposed over the first and second junction regions, a third contact disposed over the storage gate and located in an isolation region adjacent to the active region, a fourth contact disposed over the selection gate, and an interconnection line electrically connecting the third contact to the fourth contact.

According to another embodiment, there is provided a nonvolatile memory device. The nonvolatile memory device includes a first junction region and a second junction region disposed in a substrate and spaced apart from each other, a third junction region disposed in the substrate between the first and second junction regions, a first gate insulation pattern and a storage gate sequentially stacked over the substrate between the first and third junction regions, a second gate insulation pattern and a selection gate sequentially stacked over the substrate between the second and third junction regions, an interlayer insulation layer disposed over the substrate to cover the storage gate and the selection gate, a source contact plug penetrating the interlayer insulation layer to contact the first junction region, a drain contact plug penetrating the interlayer insulation layer to contact the second junction region, a coupling contact plug disposed in the interlayer insulation layer to overlap with the storage gate and insulated from the storage gate by having a portion of the interlayer insulation layer interposed between the coupling contact plug and the storage gate, a selection gate contact plug penetrating the interlayer insulation layer to contact the selection gate, and a metal interconnection line electrically connecting the coupling contact plug to the selection gate contact plug.

According to another embodiment, there is provided a method of fabricating a nonvolatile memory device. The method includes forming a gate insulation pattern and a gate electrode pattern over a substrate, forming an insulation spacer over sidewalls of the gate insulation pattern and the gate electrode pattern, forming a source region and a drain region in the substrate which are adjacent to both sidewalls of the gate electrode pattern, forming a silicide blocking layer having a multi-layered structure over the gate insulation pattern and the insulation spacer to expose the source region and the drain region, forming a first silicide layer and a second silicide layer over the exposed source region and the exposed drain region, respectively, forming an etch buffer layer over the first and second silicide layers and the silicide blocking layer, forming an interlayer insulation layer over the etch buffer layer, patterning the interlayer insulation layer to form a source contact hole exposing the first silicide layer, a drain contact hole exposing the second silicide layer, and a coupling contact hole exposing the silicide blocking layer, and forming a source contact plug, a drain contact plug, and a coupling contact plug in the source contact hole, the drain contact hole, and the coupling contact hole, respectively, wherein each of the source contact plug, the drain contact plug, and the coupling contact plug includes a metal layer.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
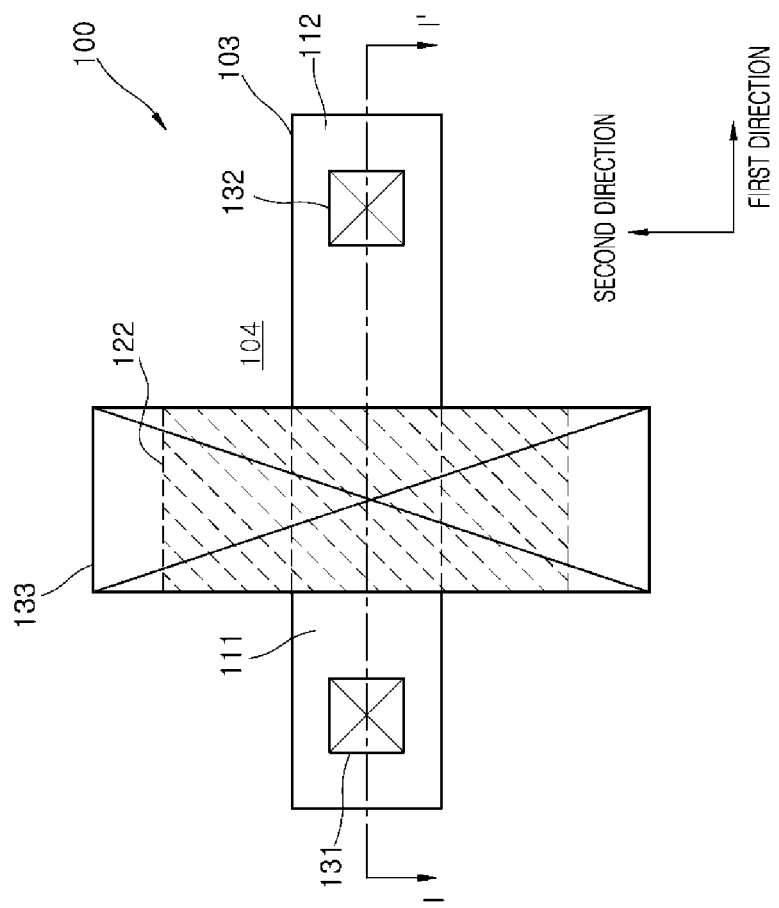
FIG. 1 is a plan view illustrating a nonvolatile memory device according to an embodiment.
Figure 2:
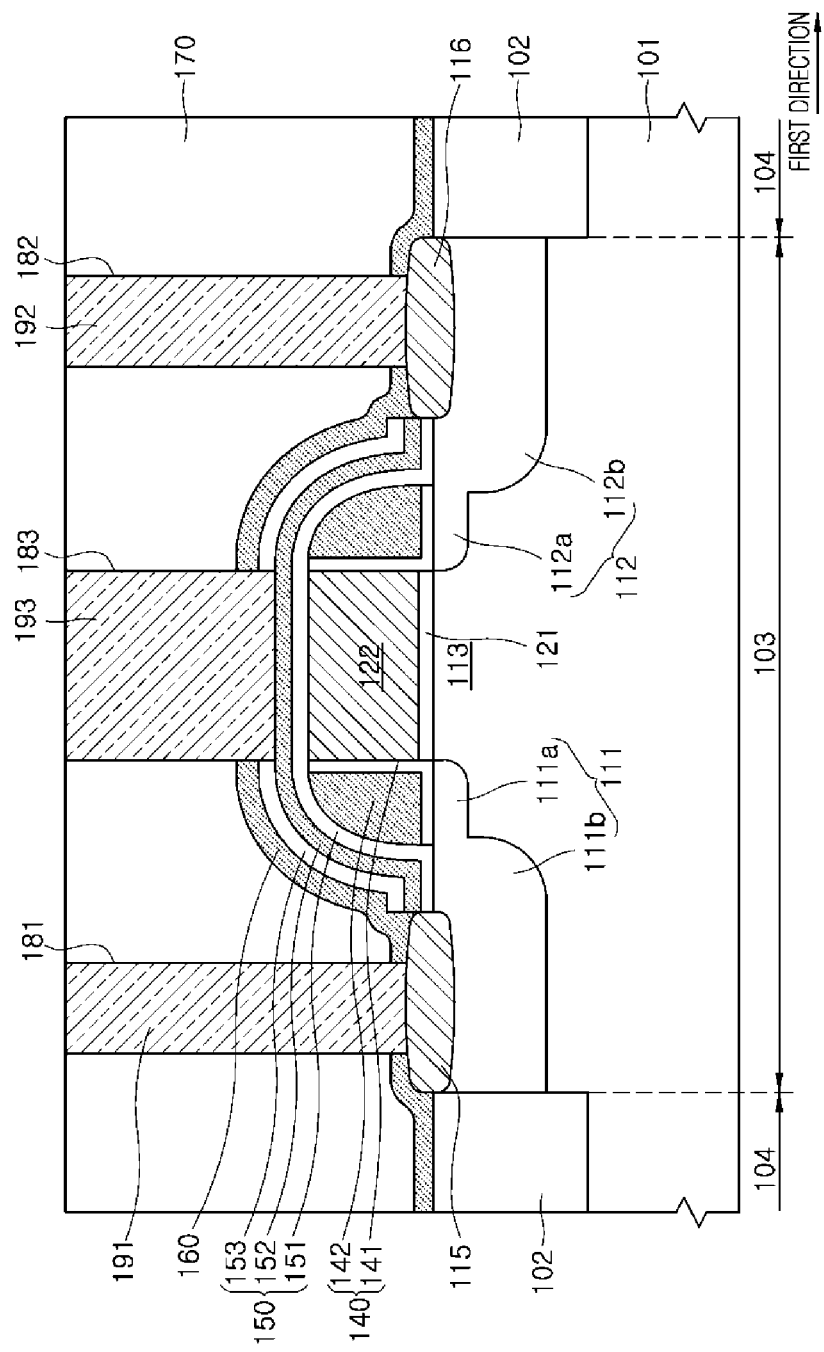
FIG. 2 is a cross-sectional view taken along a line I-I' of FIG. 1.

FIG. 1 is a plan view illustrating a nonvolatile memory device 100 according to an embodiment, and FIG. 2 is a cross-sectional view taken along a line I-I' of FIG. 1. As illustrated in FIG. 1, the nonvolatile memory device 100 may include an active region 103 extending in a first direction, which corresponds to a horizontal direction in the drawing. The active region 103 may be defined by an isolation region 104. An isolation layer may be disposed in the isolation region 104. A gate electrode pattern 122 may be disposed on the active region 103 and the isolation region 104. The gate electrode pattern 122 may be disposed to extend in a second direction that intersects, that is, crosses the first direction. Accordingly, the gate electrode pattern 122 may intersect the active region 103 and may extend onto the isolation region 104.

The active region 103 may be divided into three regions due to the gate electrode pattern 122 in a plan view. That is, a central portion of the active region 103 overlapping with the gate electrode pattern 122 may correspond to a channel region, and both ends of the active region 103 located at both sides of the channel region may correspond to a source region 111 and a drain region 112, respectively. The source region 111 and the drain region 112 may be interchangeable.

Accordingly, in some embodiments, the source region 111 could be termed a drain region and the drain region 112 could be termed a source region. A source contact hole 131 may be disposed on the source region 111, and a drain contact hole 132 may be disposed on the drain region 112.

A coupling contact hole 133 may be disposed on the gate electrode pattern 122. The coupling contact hole 133 may extend in the second direction, which corresponds to a vertical direction in the drawing. As a result, the coupling contact hole 133 may intersect the active region 103 and may overlap with the gate electrode pattern 122. A width of the coupling contact hole 133 in the first direction may be substantially equal to a width of the gate electrode pattern 122 in the first direction. A length of the coupling contact hole 133 in the second direction may be substantially greater than a length of the gate electrode pattern 122 in the second direction. Accordingly, an entire portion of the gate electrode pattern 122 may overlap with a portion of the coupling contact hole 133 when viewed in a plan view.

Referring to FIG. 2, an isolation layer 102 may be disposed in a substrate 101 of the isolation region 104. The isolation layer 102 may be a trench isolation layer. However, in some embodiments, the isolation layer 102 may not be limited to the trench isolation layer. The isolation layer 102 may define the active region 103 in the substrate 101. That is, an upper portion of the substrate 101 surrounded by the isolation layer 102 may be defined as the active region 103. The source region 111 and the drain region 112 may be respectively disposed in both ends of the active region 103, and a channel region 113 may be disposed in the active region between the source region 111 and the drain region 112. Each of the source region 111 and the drain region 112 may have a lightly doped drain (LDD) structure. That is, the source region 111 may include a source extension region 111a and a deep source region 111b, and the drain region 112 may include a drain extension region 112a and a deep drain region 112b. A first silicide layer 115 may be disposed on the deep source region 111b, and a second silicide layer 116 may be disposed on the deep drain region 112b.

A gate insulation pattern 121 may be disposed on the channel region 113 of the active region 103. In some embodiments, the gate insulation pattern 121 may include an oxide material. The gate insulation pattern 121 may serve as a tunnel insulation layer. The gate electrode pattern 122 may be disposed on the gate insulation pattern 121. In some embodiments, the gate electrode pattern 122 may include a single polysilicon layer. Alternatively, the gate electrode pattern 122 may include a conductive layer other than a polysilicon layer. The gate insulation pattern 121 and the gate electrode pattern 122 may be vertically aligned with each other. That is, sidewalls of the gate electrode pattern 122 may be vertically aligned with sidewalls of the gate insulation pattern 121. The gate electrode pattern 122 may function as a floating gate.

An insulation spacer 140 may be disposed on sidewalls of the gate electrode pattern 122, respectively. The insulation spacer 140 may vertically extend to cover sidewalls of the gate insulation pattern 121. The insulation spacer 140 may include an oxide layer 141 disposed on sidewalls of the gate insulation pattern 121 and the gate electrode pattern 122 and have an "L"-shape. A nitride layer 142 may be disposed on a sidewall of the oxide layer 141. That is, the oxide layer 141 may be disposed to cover the sidewalls of the gate insulation pattern 121 and the gate electrode pattern 122 and extend onto the source extension region 111a and the drain extension region 112a. The nitride layer 142 may be disposed to cover an outer sidewall of the oxide layer 141. In some embodiments, the insulation spacer 140 may include solely the nitride layer 142. The insulation spacer 140 may be spaced apart from the first and second silicide layers 115 and 116. Accordingly, a portion of the source region 111 may be exposed between the first silicide layer 115 on the deep source region 111b and the insulation spacer 140 on the source extension region 111a, and a portion of the drain region 112 may be exposed between the second silicide layer 116 on the deep drain region 112b and the insulation spacer 140 on the drain extension region 112a.

A silicide blocking layer 150 may be disposed on the insulation spacer 140 and the gate electrode pattern 122. The silicide blocking layer 150 may be disposed to prevent the silicidation of a specific portion of the nonvolatile memory device 100 for example, the gate electrode pattern 122, while the first and second silicide layers 115 and 116 are formed. The silicide blocking layer 150 may have a multi-layered structure including a first insulation layer 151, a second insulation layer 152 and a third insulation layer 153 which are sequentially stacked. In some embodiments, each of the first and third insulation layers 151 and 153 may include an oxide material, the second insulation layer 152 may include a material having an etch selectivity with respect to the third insulation layer 153. For example, if the third insulation layer 153 includes an oxide material, the second insulation layer 152 may include a nitride material. In some other embodiments, the second insulation layer 152 may include a metal oxide material. For example, the second insulation layer 152 may include an aluminum oxide ($Al_2O_3$) material, a tantalum oxide ($Ta_2O_5$) material, a hafnium oxide ($HfO_2$) material, or a combination thereof. Although FIG. 2 illustrates an example in which the silicide blocking layer 150 includes three insulation layers, the number of the insulation layers constituting the silicide blocking layer 150 is not limited to three. For example, in some embodiments, the silicide blocking layer 150 may include four or more insulation layers.

An etch buffer layer 160 may be disposed on the first silicide layer 115, a second silicide layer 116 and the silicide blocking layer 150. The etch buffer layer 160 may extend to cover the isolation layer 102. An interlayer insulation layer 170 may be disposed on the etch buffer layer 160. In some embodiments, the interlayer insulation layer 170 may include an oxide material. The etch buffer layer 160 may include a material having an etch selectivity with respect to the interlayer insulation layer 170. For example, if the interlayer insulation layer 170 is an oxide layer, the etch buffer layer 160 may include a nitride layer.

The first silicide layer 115 may be exposed by a first contact hole 181 penetrating the interlayer insulation layer 170 and the etch buffer layer 160, and the second first silicide layer 116 may be exposed by a second contact hole 182 penetrating the interlayer insulation layer 170 and the etch buffer layer 160. In addition, the second insulation layer 152 of the silicide blocking layer 150 may be exposed by a third contact hole 183 penetrating the interlayer insulation layer 170, the etch buffer layer 160 and the third insulation layer 153. The third contact hole 183 may be disposed over the gate electrode pattern 122. The first, second and third contact holes 181, 182 and 183 may correspond to the source contact hole 131, the drain contact hole 132 and the coupling contact hole 133 illustrated in FIG. 1, respectively.

The first, second and third contact holes 181, 182 and 183 may be filled with a source contact plug 191, a drain contact plug 192 and a coupling contact plug 193, respectively. Thus, a bottom surface of the source contact plug 191 and a bottom surface of the drain contact plug 192 may contact the first and second silicide layers 115 and 116, respectively. In addition, a bottom surface of the coupling contact plug 193 may contact the second insulation layer 152 of the silicide blocking layer 150. Top surfaces of the source contact plug 191, the drain contact plug 192 and the coupling contact plug 193 may be exposed at a top surface of the interlayer insulation layer 170. More specifically, the top surfaces of the source contact plug 191, the drain contact plug 192 and the coupling contact plug 193 may be coplanar with the top surface of the interlayer insulation layer 170. The source contact plug 191, the drain contact plug 192 and the coupling contact plug 193 may include the same conductive material. In some embodiments, each of the source contact plug 191, the drain contact plug 192 and the coupling contact plug 193 may include a tungsten material. Although not shown in the drawings, interconnection lines may be disposed on the top surfaces of the source contact plug 191, the drain contact plug 192 and the coupling contact plug 193.

The first and second insulation layers 151 and 152 of the silicide blocking layer 150 may be disposed between the gate electrode pattern 122 and the coupling contact plug 193. A combination layer of the first and second insulation layers 151 and 152 may serve as an inter-gate insulation layer. The gate electrode pattern 122, the first and second insulation layers 151 and 152, and the coupling contact plug 193, which are vertically stacked, may constitute a vertical coupling capacitor. If a bias voltage is applied to the coupling contact plug 193, a coupling bias may be induced at the gate electrode pattern 122 due to a coupling ratio of a cell illustrated in FIG. 2. The coupling ratio of the cell illustrated in FIG. 2 may be expressed using various coupling capacitance values. If a coupling bias is induced at the gate electrode pattern 122, a program operation, an erasure operation or a read operation may be executed according to the coupling bias.

The gate electrode pattern 122, the source contact plug 191, and insulation layers between the gate electrode pattern 122 and the source contact plug 191 may constitute a horizontal coupling capacitor. Similarly, the gate electrode pattern 122, the drain contact plug 192, and insulation layers between the gate electrode pattern 122 and the drain contact plug 192 may constitute another horizontal coupling capacitor. Accordingly, if bias voltages are applied to the source contact plug 191 and the drain contact plug 192, the horizontal coupling capacitors may also influence the coupling bias that is induced at the gate electrode pattern 122. As a result, the coupling bias induced at the gate electrode pattern 122 may be determined by coupling capacitance values of the horizontal coupling capacitors including the source and drain contact plugs 191 and 192 and a coupling capacitance value of the vertical coupling capacitor including the coupling contact plug 193.

In the nonvolatile memory device 100 according to the present embodiment, the source and drain contact plugs 191 and 192 and the coupling contact plug 193 may be simultaneously formed in the same process step. For example, the source contact plug 191, the drain contact plug 192 and the coupling contact plug 193 may be formed to include a tungsten material. In the present embodiment, the coupling contact plug 193 may serve as a control gate electrode and the gate electrode pattern 122 may serve as a floating gate. Thus, an additional process step for forming the coupling contact plug 193 serving as a control gate electrode may not be required since the coupling contact plug 193 is formed while the source and drain contact plugs 191 and 192 are formed. For example, extra process steps for forming a polysilicon layer and patterning the polysilicon layer may not be required to form a control gate electrode. Thus, the nonvolatile memory device 100 illustrated in FIG. 2 may be fabricated using a complementary metal-oxide-semiconductor (CMOS) compatible process.

Figure 3:
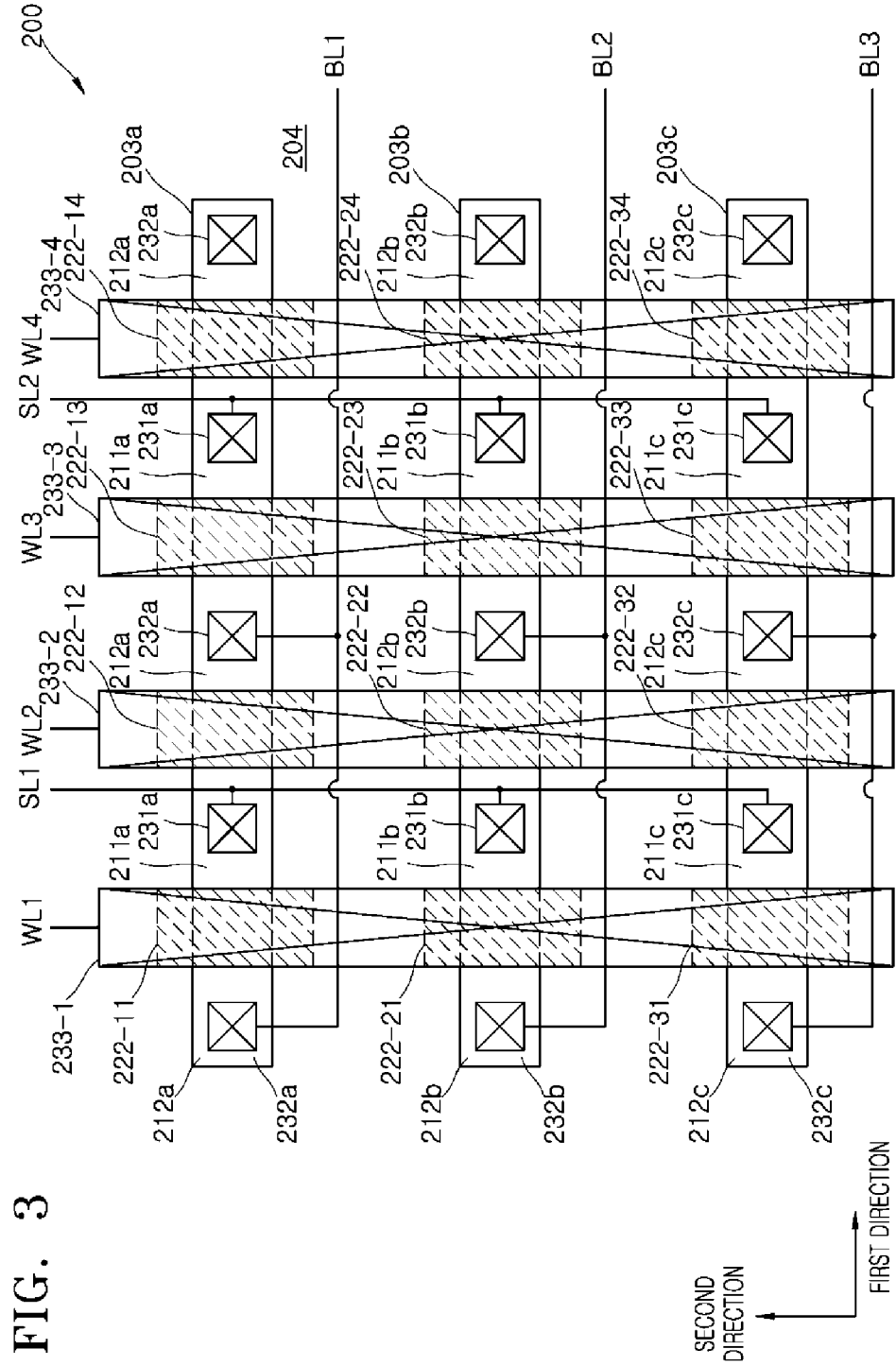
FIG. 3 is a plan view illustrating a cell array portion of a nonvolatile memory device according to an embodiment.

FIG. 3 is a plan view illustrating a cell array portion 200 of a nonvolatile memory device according to an embodiment. Referring to FIG. 3, the cell array portion 200 may include a plurality of cells which are located at cross points of a plurality of rows and a plurality of columns. The cell array portion 200 may be configured to include a plurality of active regions 203a, 203b and 203c respectively disposed in the plurality of rows and a plurality of gate electrode patterns respectively located at cross points of the plurality of rows and the plurality of columns. The plurality of active regions 203a, 203b and 203c may be disposed to extend in a first direction which corresponds to a horizontal direction in the drawing. The plurality of active regions 203a, 203b and 203c may be arrayed to be spaced apart from each other in a second direction which corresponds to a vertical direction in the drawing. The active regions 203a, 203b and 203c may be defined by an isolation region 204. An isolation layer may be disposed in the isolation region 204. Each of the active regions 203a, 203b and 203c may be disposed in any one of the plurality of rows of the cell array portion 200. For example, the active region 203a may be disposed in a first row of the cell array portion 200, and the active region 203b may be disposed in a second row of the cell array portion 200. In addition, the active region 203c may be disposed in a third row of the cell array portion 200. The number of the active regions that is, the rows, and the number of cells disposed in each active region may vary according to an embodiment.

A plurality of gate electrode patterns 222-11, 222-12, 222-13 and 222-14 may be disposed on the active region 203a in the first row and may extend onto the isolation region 204 adjacent to the active region 203a. That is, each of the gate electrode patterns 222-11, 222-12, 222-13 and 222-14 may extend in the second direction to intersect the active region 203a. The gate electrode patterns 222-11, 222-12, 222-13 and 222-14 may be arrayed to be spaced apart from each other in the first direction. Drain regions 212a and source regions 211a may be alternately disposed in portions of the active region 203a, which are located at both sides of each of the gate electrode patterns 222-11, 222-12, 222-13 and 222-14.

Each of the gate electrode patterns 222-11, 222-12, 222-13 and 222-14 may be disposed in any one of the plurality of columns of the cell array portion 200. For example, the gate electrode patterns 222-11 may be located at a cross point of the first row and a first column of the cell array portion 200, and the gate electrode patterns 222-12 may be located at a cross point of the first row and a second column of the cell array portion 200. Moreover, the gate electrode patterns 222-13 may be located at a cross point of the first row and a third column of the cell array portion 200, and the gate electrode patterns 222-14 may be located at a cross point of the first row and a fourth column of the cell array portion 200. The number of the columns of the cell array portion 200 may vary according to an embodiment.

A plurality of gate electrode patterns 222-21, 222-22, 222-23 and 222-24 may be disposed on the active region 203b in the second row and may extend onto the isolation region 204 adjacent to the active region 203b. That is, each of the gate electrode patterns 222-21, 222-22, 222-23 and 222-24 may extend in the second direction to intersect the active region 203b. The gate electrode patterns 222-21, 222-22, 222-23 and 222-24 may be spaced apart from each other in the first direction. The gate electrode pattern 222-21 and the gate electrode pattern 222-11 may be spaced apart from each other in the second direction and may be disposed in the first column. The gate electrode pattern 222-22 and the gate electrode pattern 222-12 may be spaced apart from each other in the second direction and may be disposed in the second column. The gate electrode pattern 222-23 and the gate electrode pattern 222-13 may be spaced apart from each other in the second direction and may be disposed in the third column. The gate electrode pattern 222-24 and the gate electrode pattern 222-14 may be spaced apart from each other in the second direction and may be disposed in the fourth column. Drain regions 212b and source regions 211b may be alternately disposed in portions of the active region 203b, which are located at both sides of each of the gate electrode patterns 222-21, 222-22, 222-23 and 222-24.

Each of the gate electrode patterns 222-21, 222-22, 222-23 and 222-24 may be disposed in any one of the plurality of columns of the cell array portion 200. For example, the gate electrode patterns 222-21 may be located at a cross point of the second row and the first column of the cell array portion 200, and the gate electrode patterns 222-22 may be located at a cross point of the second row and the second column of the cell array portion 200. Moreover, the gate electrode patterns 222-23 may be located at a cross point of the second row and the third column of the cell array portion 200, and the gate electrode patterns 222-24 may be located at a cross point of the second row and the fourth column of the cell array portion 200.

A plurality of gate electrode patterns 222-31, 222-32, 222-33 and 222-34 may be disposed on the active region 203c in the third row and may extend onto the isolation region 204 adjacent to the active region 203c. That is, each of the gate electrode patterns 222-31, 222-32, 222-33 and 222-34 may extend in the second direction to intersect the active region 203c. The gate electrode patterns 222-31, 222-32, 222-33 and 222-34 may spaced apart from each other in the first direction. The gate electrode patterns 222-11, 222-21 and 222-31 may be spaced apart from each other in the second direction and may be disposed in the first column. The gate electrode patterns 222-12, 222-22 and 222-32 may be spaced apart from each other in the second direction and may be disposed in the second column. The gate electrode patterns 222-13, 222-23 and 222-33 may be spaced apart from each other in the second direction and may be disposed in the third column. The gate electrode patterns 222-14, 222-24 and 222-34 may be spaced apart from each other in the second direction and may be disposed in the fourth column. Drain regions 212c and source regions 211c may be alternately disposed in portions of the active region 203c, which are located at both sides of each of the gate electrode patterns 222-31, 222-32, 222-33 and 222-34.

Each of the gate electrode patterns 222-31, 222-32, 222-33 and 222-34 may be disposed in any one of the plurality of columns of the cell array portion 200. For example, the gate electrode patterns 222-31 may be located at a cross point of the third row and the first column of the cell array portion 200, and the gate electrode patterns 222-32 may be located at a cross point of the third row and the second column of the cell array portion 200. Moreover, the gate electrode patterns 222-33 may be located at a cross point of the third row and the third column of the cell array portion 200, and the gate electrode patterns 222-34 may be located at a cross point of the third row and the fourth column of the cell array portion 200.

A first coupling contact hole 233-1 may be disposed on the gate electrode patterns 222-11, 222-21 and 222-31 arrayed in the first column. That is, the first coupling contact hole 233-1 may extend in the second direction to expose the gate electrode patterns 222-11, 222-21 and 222-31 constituting cells arrayed in the first column. A width of the first coupling contact hole 233-1 in the first direction may be substantially equal to a width of the gate electrode patterns 222-11, 222-21 and 222-31 in the first direction. An entire portion of each gate electrode pattern 222-11, 222-21 or 222-31 may overlap with a portion of the first coupling contact hole 233-1 in a plan view. The first coupling contact hole 233-1 may be filled with a coupling contact plug, as described with reference to FIG. 2.

A second coupling contact hole 233-2 may be disposed on the gate electrode patterns 222-12, 222-22 and 222-32 arrayed in the second column. That is, the second coupling contact hole 233-2 may extend in the second direction to expose the gate electrode patterns 222-12, 222-22 and 222-32 constituting cells arrayed in the second column. A width of the second coupling contact hole 233-2 in the first direction may be substantially equal to a width of the gate electrode patterns 222-12, 222-22 and 222-32 in the first direction. An entire portion of each gate electrode pattern 222-12, 222-22 or 222-32 may overlap with a portion of the second coupling contact hole 233-2 in a plan view. The second coupling contact hole 233-2 may be filled with a coupling contact plug, as described with reference to FIG. 2.

A third coupling contact hole 233-3 may be disposed on the gate electrode patterns 222-13, 222-23 and 222-33 arrayed in the third column. That is, the third coupling contact hole 233-3 may extend in the second direction to expose the gate electrode patterns 222-13, 222-23 and 222-33 constituting cells arrayed in the third column. A width of the third coupling contact hole 233-3 in the first direction may be substantially equal to a width of the gate electrode patterns 222-13, 222-23 and 222-33 in the first direction. An entire portion of each gate electrode pattern 222-13, 222-23 or 222-33 may overlap with a portion of the third coupling contact hole 233-3 in a plan view. The third coupling contact hole 233-3 may be filled with a coupling contact plug, as described with reference to FIG. 2.

Source contact holes 231a may be respectively disposed on the source regions 211a arrayed in the active region 203a which is disposed in the first row, and drain contact holes 232a may be respectively disposed on the drain regions 212a arrayed in the active region 203a which is disposed in the first row. In addition, source contact holes 231b may be respectively disposed on the source regions 211b arrayed in the active region 203b which is disposed in the second row, and drain contact holes 232b may be respectively disposed on the drain regions 212b arrayed in the active region 203b which is disposed in the second row. Moreover, source contact holes 231c may be respectively disposed on the source regions 211c arrayed in the active region 203c which is disposed in the third row, and drain contact holes 232c may be respectively disposed on the drain regions 212c arrayed in the active region 203c which is disposed in the third row. Each of the source contact holes 231a, 231b and 231c may be filled with a source contact plug, as described with reference to FIG. 2. Similarly, each of the drain contact holes 232a, 232b and 232c may be filled with a drain contact plug, as described with reference to FIG. 2.

The source contact plugs filling the source contact holes 231a, 231b and 231c disposed between two neighboring columns may be electrically connected to a single source line. That is, the source contact plugs filling the source contact holes 231a, 231b and 231c disposed between the first and second columns may be electrically connected to a first source line SL1, and the source contact plugs filling the source contact holes 231a, 231b and 231c disposed between the third and fourth columns may be electrically connected to a second source line SL2. The drain contact plugs filling the drain contact holes 232a, 232b or 232c disposed in the same row may be electrically connected to a single bit line. That is, the drain contact plugs filling the drain contact holes 232a disposed in the first row may be electrically connected to a first bit line BL1, and the drain contact plugs filling the drain contact holes 232b disposed in the second row may be electrically connected to a second bit line BL2. In addition, the drain contact plugs filling the drain contact holes 232c disposed in the third row may be electrically connected to a third bit line BL3. The coupling contact plug filling the coupling contact hole 233-1, 233-2 or 233-3 disposed in the same column may be electrically connected to a single word line. That is, the coupling contact plug filling the first coupling contact hole 233-1 disposed in the first column may be electrically connected to a first word line WL1, and the coupling contact plug filling the second coupling contact hole 233-2 disposed in the second column may be electrically connected to a second word line WL2. Similarly, the coupling contact plug filling the third coupling contact hole 233-3 disposed in the third column may be electrically connected to a third word line WL3, and the coupling contact plug filling the fourth coupling contact hole 233-4 disposed in the fourth column may be electrically connected to a fourth word line WL4.

In an embodiment, the cell array portion 200 having a "3×4" matrix form is provided as shown in FIG. 3. The cells arrayed in each row may share the active regions 203a, 203b or 203c with each other. The cells arrayed in each column may share the first, the second, the third, or the fourth coupling contact holes 233-1, 233-2, 233-3 and 233-4 with each other. A cross-sectional view of each cell may be identical to the cross-sectional view of FIG. 2. Accordingly, in the case of the cell located at a cross point of the first row and the first column, the first and second insulation layers (151 and 152 of FIG. 2) of the silicide blocking layer (150 of FIG. 2) may be disposed between the coupling contact plug in the first coupling contact hole 233-1 and the gate electrode pattern 222-11. During a program operation or a read operation, one of the rows of the cell array portion 200 may be selected by applying a predetermined bit line voltage to one of the bit lines BL1~BL3 and one of the cells arrayed in the selected row may be selected by applying a predetermined word line voltage to one of the word lines WL1~WL4 and/or a predetermined source line voltage to one of the source lines SL1 and SL2.

Figure 4:
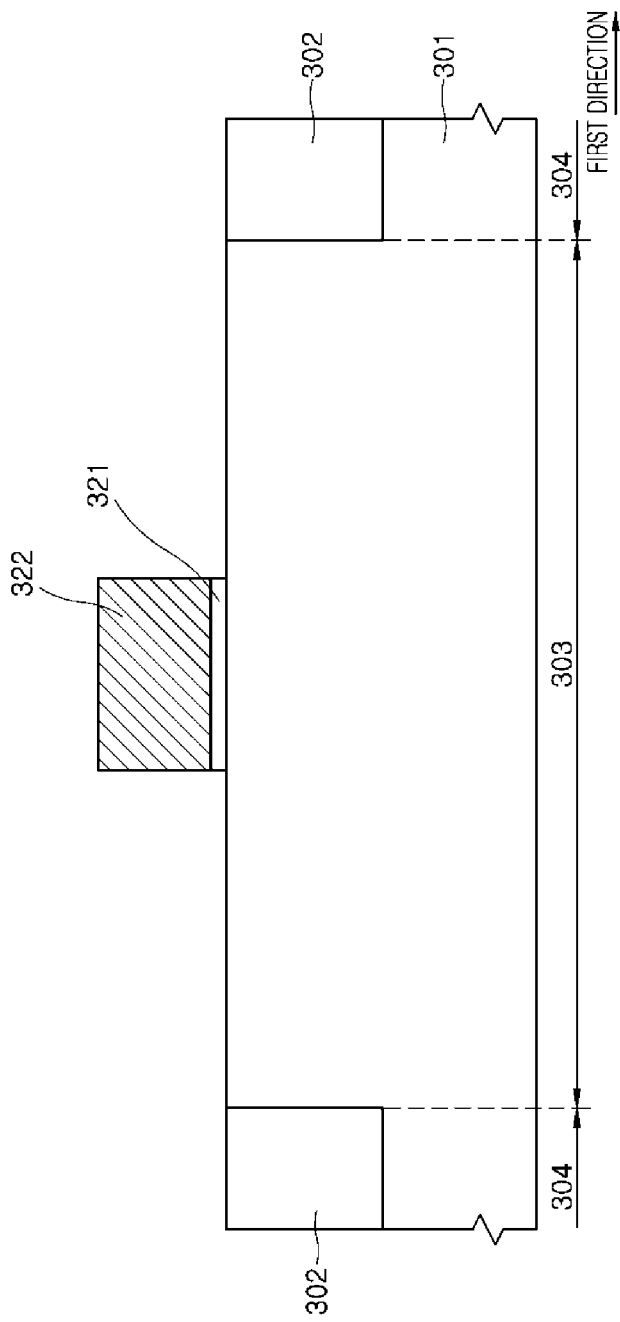
FIGS. 4 to 12 are cross-sectional views illustrating a method of fabricating a nonvolatile memory device according to an embodiment.

FIGS. 4 to 12 are cross-sectional views illustrating a method of fabricating a nonvolatile memory device according to an embodiment. In FIGS. 4 to 12, the same reference numerals or the same reference designators denote the same elements. As illustrated in FIG. 4, an isolation layer 302 may be formed in a substrate 301 in an isolation region 303 to define an active region 303. The isolation layer 302 may be formed using a trench isolation process. In some embodiments, the substrate 301 may be a P-type substrate. After the isolation layer 302 is formed, a well region (not shown) may be additionally formed in the substrate 301 using an ion implantation process if necessary. A gate insulation layer and a gate electrode layer may be sequentially formed on the substrate 301 and the isolation layer 302. In some embodiments, the gate insulation layer may be formed of an oxide layer and the gate electrode layer may be formed of a polysilicon layer. If the gate electrode layer is formed of a polysilicon layer, the polysilicon layer may be doped with impurities during or after formation of the polysilicon layer. The gate electrode layer and the gate insulation layer may be patterned using a mask pattern (not shown) to selectively remove portions of the gate electrode layer and the gate insulation layer. As a result, a gate insulation pattern 321 and a gate electrode pattern 322 may be formed on a portion of the active region 303. Although not shown in the cross-sectional view of FIG. 4, the active region 303 may extend in one direction for example, a first direction of FIG. 4, when viewed from a plan view, as described with reference to FIG. 1. In addition, the gate insulation pattern 321 and the gate electrode pattern 322 may intersect the active region 303 when viewed from a plan view. After the gate insulation pattern 321 and the gate electrode pattern 322 are formed, the mask pattern used in formation of the gate insulation pattern 321 and the gate electrode pattern 322 may be removed. The gate insulation pattern 321 and the gate electrode pattern 322 may be formed while other gate insulation patterns and other gate electrode patterns constituting MOS transistors of a CMOS circuit are formed on the substrate 301 in a peripheral circuit region.

Figure 5:
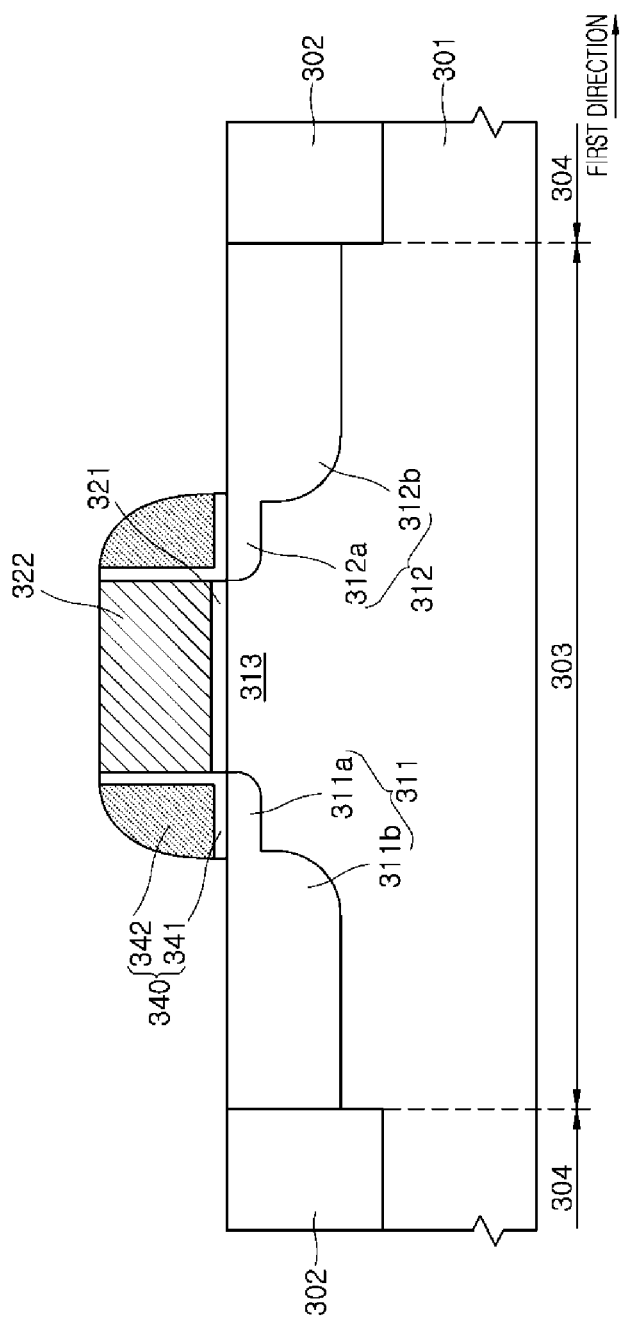

Referring to FIG. 5, impurity ions may be implanted into the active region 303 using the gate electrode pattern 322 as an ion implantation mask, thereby forming a source extension region 311a and a drain extension region 312a. The impurity ions for forming the source extension region 311a and the drain extension region 312a may be N-type impurity ions. The source extension region 311a and the drain extension region 312a may be self-aligned with the gate electrode pattern 322. The source extension region 311a and the drain extension region 312a may have a relatively shallow junction depth. An insulation spacer layer may then be formed on an entire surface of the resultant including the source extension region 311a and the drain extension region 312a. In some embodiments, the insulation spacer layer may be formed by sequentially stacking an oxide layer and a nitride layer. The insulation spacer layer may be etched using an anisotropic etch process to form an oxide spacer 341 and a nitride spacer 342 that cover on sidewalls of a gate pattern including the gate insulation pattern 321 and the gate electrode pattern 322. The oxide spacer 341 may be formed to cover sidewalls of the gate insulation pattern 321 and the gate electrode pattern 322 and to extend onto the source extension region 311a and the drain extension region 312a, and the nitride spacer 342 may be formed to cover an outer sidewall of the oxide spacer 341. The oxide spacer 341 and the nitride spacer 342 may constitute an insulation spacer 340.

After the insulation spacer 340 is formed on sidewalls of the gate pattern, impurity ions may be implanted into the active region 303 using the gate electrode pattern 322 and the insulation spacer 340 as ion implantation masks, thereby forming a deep source region 311b and a deep drain region 312b. As a result, the deep source region 311b and the deep drain region 312b may be self-aligned with the insulation spacer 340. The deep source region 311b and the deep drain region 312b may be formed to be deeper than the source extension region 311a and the drain extension region 312a. The source extension region 311a and the deep source region 311b may constitute a source region 311 having an LDD structure, and the drain extension region 312a and the deep drain region 312b may constitute a drain region 312 having an LDD structure.

Figure 6:
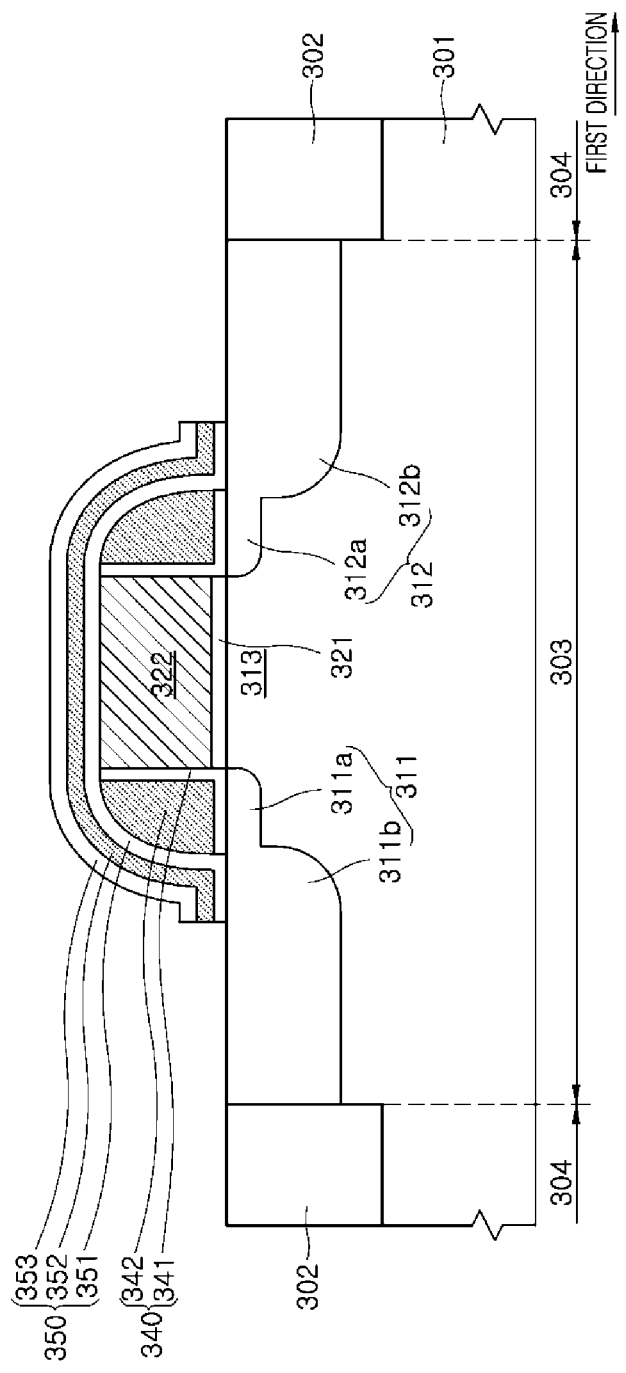

Referring to FIG. 6, a silicide blocking layer 350 may be formed to cover the insulation spacer 340 and the gate electrode pattern 322. The silicide blocking layer 350 may laterally extend to cover a portion of the deep source region 311b and a portion of the deep drain region 312b. That is, the silicide blocking layer 350 may be formed to expose another portion of the deep source region 311b and another portion of the deep drain region 312b on which a silicide layer is formed in a subsequent process. In some embodiments, the silicide blocking layer 350 may be formed to have a multi-layered structure including a first insulation layer 351, a second insulation layer 352 and a third insulation layer 353 which are sequentially stacked. The first and third insulation layers 351 and 353 may be formed of oxide layers, and the second insulation layer 352 may be formed of a material layer having an etch selectivity with respect to the third insulation layer 353. For example, if the first and third insulation layers 351 and 353 are formed of oxide layers, the second insulation layer 352 may be formed of a nitride layer. In some other embodiments, the second insulation layer 352 may include a metal oxide material. For example, the second insulation layer 352 may include an aluminum oxide ($Al_2O_3$) material, a tantalum oxide ($Ta_2O_5$) material, a hafnium oxide ($HfO_2$) material, or a combination thereof. Although FIG. 2 illustrates an example in which the silicide blocking layer 350 is formed to include three insulation layers, the number of the insulation layers constituting the silicide blocking layer 350 is not limited to three. For example, in some embodiments, the silicide blocking layer 350 may be formed to include four or more insulation layers.

Figure 7:
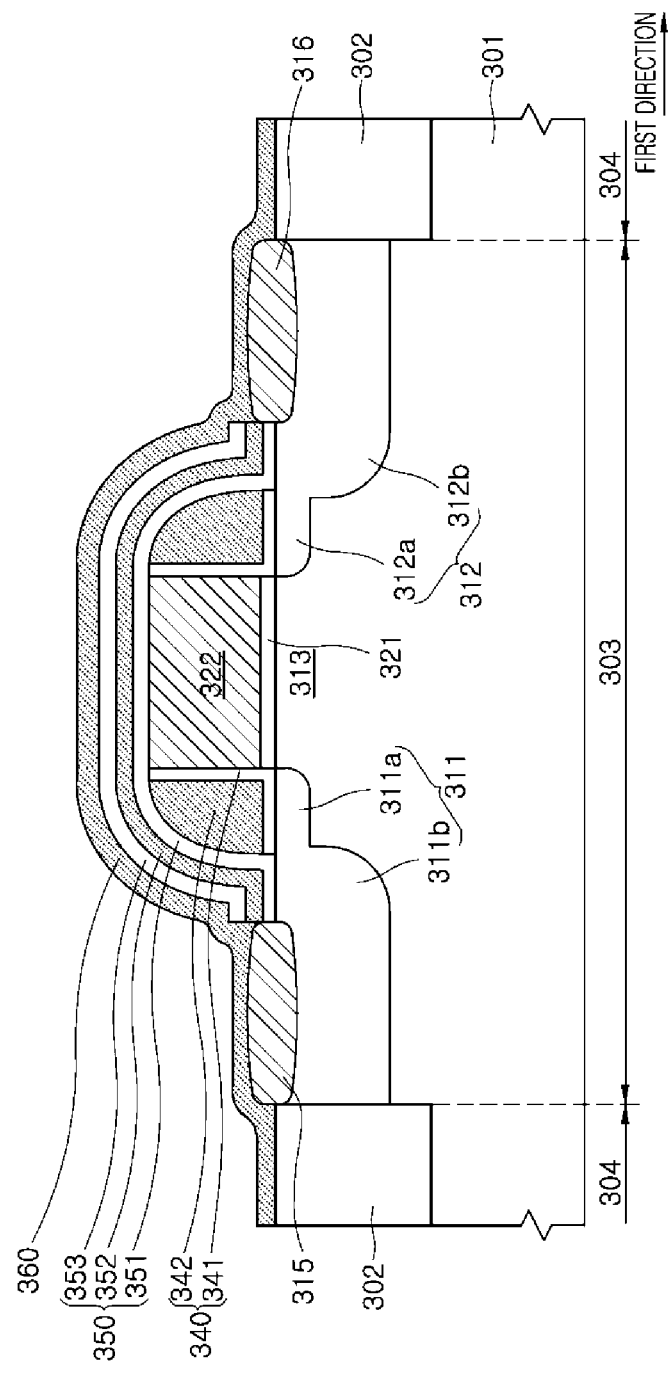

Referring to FIG. 7, a first silicide layer 315 and a second silicide layer 316 may be formed on the exposed portion of the deep source region 311b and the exposed portion of the deep drain region 312b, respectively. While the first and second silicide layers 315 and 316 are formed, the gate electrode pattern 322 may be covered with the silicide blocking layer 350 so that no silicide layer is formed on a top surface of the gate electrode pattern 322. To form the first and second silicide layers 315 and 316, a metal layer may be formed on an entire surface of the resultant including the silicide blocking layer 350. The metal layer may be formed of, for example, a tungsten (W) layer, a molybdenum (Mo) layer, a titanium (Ti) layer, or a cobalt (Co) layer. In some embodiments, the metal layer for forming the first and second silicide layers 315 and 316 may be formed using a sputtering process. The metal layer may be annealed at a predetermined temperature to chemically react on silicon atoms in the source region 311 and the drain region 312. As a result, the first and second silicide layers 315 and 316 may be formed on the source region 311 and the drain region 312. Here, "self-aligned" means that the silicide (salicide) layers 315 and 316 are formed without using a masking process. After the first and second silicide layers 315 and 316 are formed, the unreacted portion of the metal layer may be removed.

Although not shown in the drawings, in the event that other active elements such as, MOS transistors are formed on another region of the substrate 301, other silicide layers may also be formed on source/drain regions and gate electrode patterns of the MOS transistors while the first and second silicide layers 315 and 316 are formed. In general MOS transistors, silicide layers may be formed on gate electrode patterns and interconnection lines for applying gate bias voltages to the gate electrode patterns that may be formed on the silicide layers of the gate electrode patterns. This results in reducing a contact resistance value between the gate electrode patterns and the interconnection lines electrically connected to the gate electrode patterns. The gate electrode pattern 322 may serve as a floating gate of a nonvolatile memory cell. If a silicide layer is formed on the gate electrode pattern 322, charges stored in the gate electrode pattern 322 may be readily diffused out of or drifted into an insulation layer surrounding the gate electrode pattern 322 due to a poor interface characteristic between the silicide layer and the insulation layer. That is, the silicide layer on the gate electrode pattern 322 may degrade a charge retention characteristic of the gate electrode pattern 322. Thus, the silicidation process for forming the first and second silicide layers 315 and 316 may be performed after formation of the silicide blocking layer 350 so that no silicide layer is formed on the gate electrode pattern 322. In some embodiments, the silicide blocking layer 350 may have a multi-layered structure including a plurality of insulation layers that have different etch rates from each other. This is for controlling a depth of a contact hole which is formed over the gate electrode pattern 322 in a subsequent process.

After the first and second silicide layers 315 and 316 are formed and the unreacted portion of the metal layer is removed, an etch buffer layer 360 may be formed on the first and second silicide layers 315 and 316 and the silicide blocking layer 350. The etch buffer layer 360 may be formed of a material layer having an etch rate which is lower than an etch rate of an interlayer insulation layer which is formed on the etch buffer layer 360 in a subsequent process. That is, the etch buffer layer 360 may be formed of a material layer having an etch selectivity with respect to the interlayer insulation layer which is formed on the etch buffer layer 360 in a subsequent process. In some embodiments, if the interlayer insulation layer is formed of an oxide layer, the etch buffer layer 360 may be formed of a nitride layer.

Figure 8:
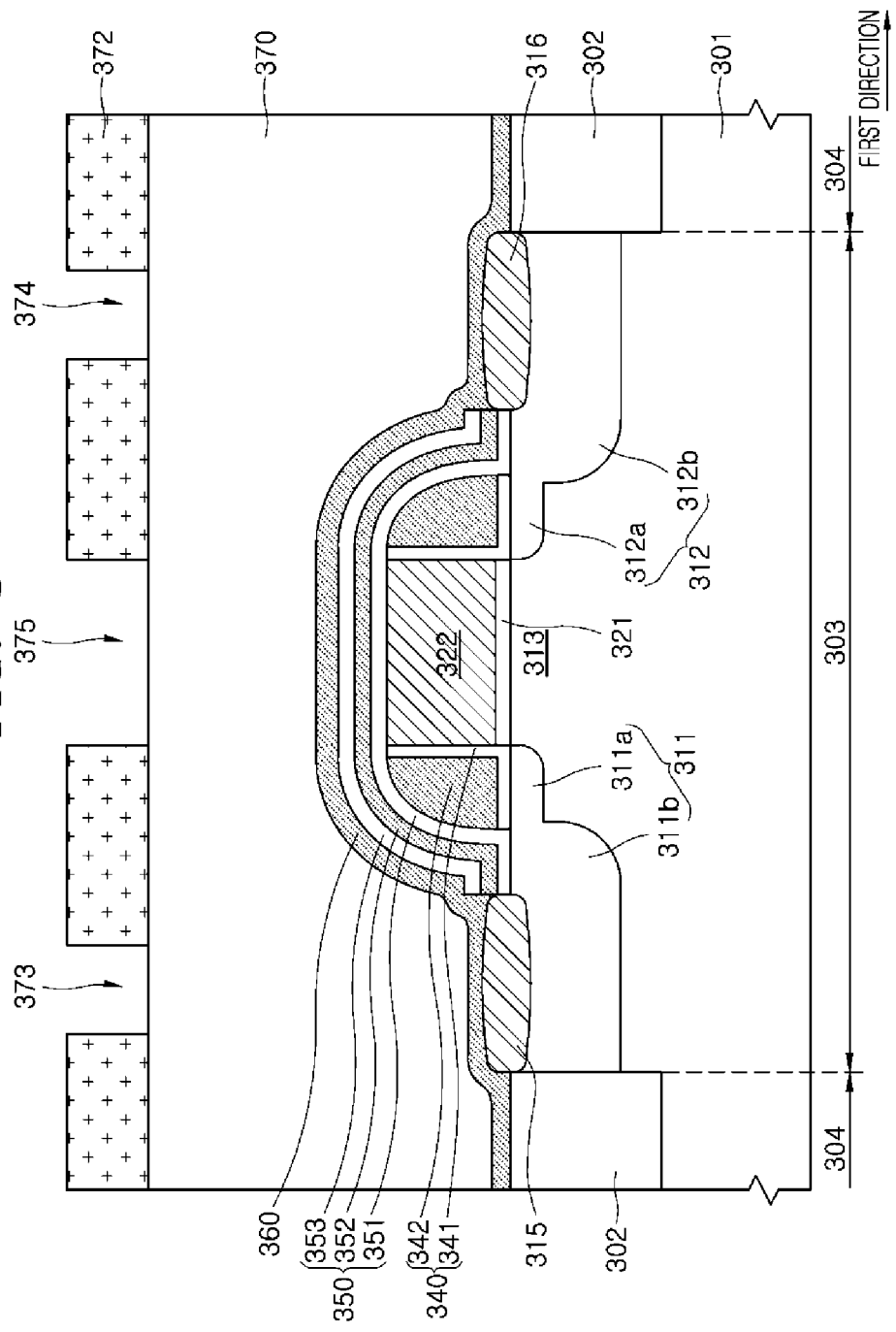

Referring to FIG. 8, an interlayer insulation layer 370 may be formed on the etch buffer layer 360. As described above with reference to FIG. 7, the interlayer insulation layer 370 may be formed of a material layer having an etch selectivity with respect to the etch buffer layer 360. Thus, the material layers of the interlayer insulation layer 370 and the etch buffer layer 360 may be selected in consideration of a ratio of etch rates of the interlayer insulation layer 370 and the etch buffer layer 360 exposed to a predetermined etch recipe. In some embodiments, the interlayer insulation layer 370 may be formed of an oxide layer. In some other embodiments, the interlayer insulation layer 370 may be formed to have a multi-layered structure including a plurality of insulation layers. After the interlayer insulation layer 370 is formed, an etch mask pattern 372 may be formed on the interlayer insulation layer 370. In some embodiments, the etch mask pattern 372 may be formed of a photoresist layer. The etch mask pattern 372 may be formed to have openings 373, 374 and 375 that expose portions of the interlayer insulation layer 370. The openings 373, 374 and 375 may be formed over the first silicide layer 315, the second silicide layer 316, and the gate electrode pattern 322, respectively.

Figure 9:
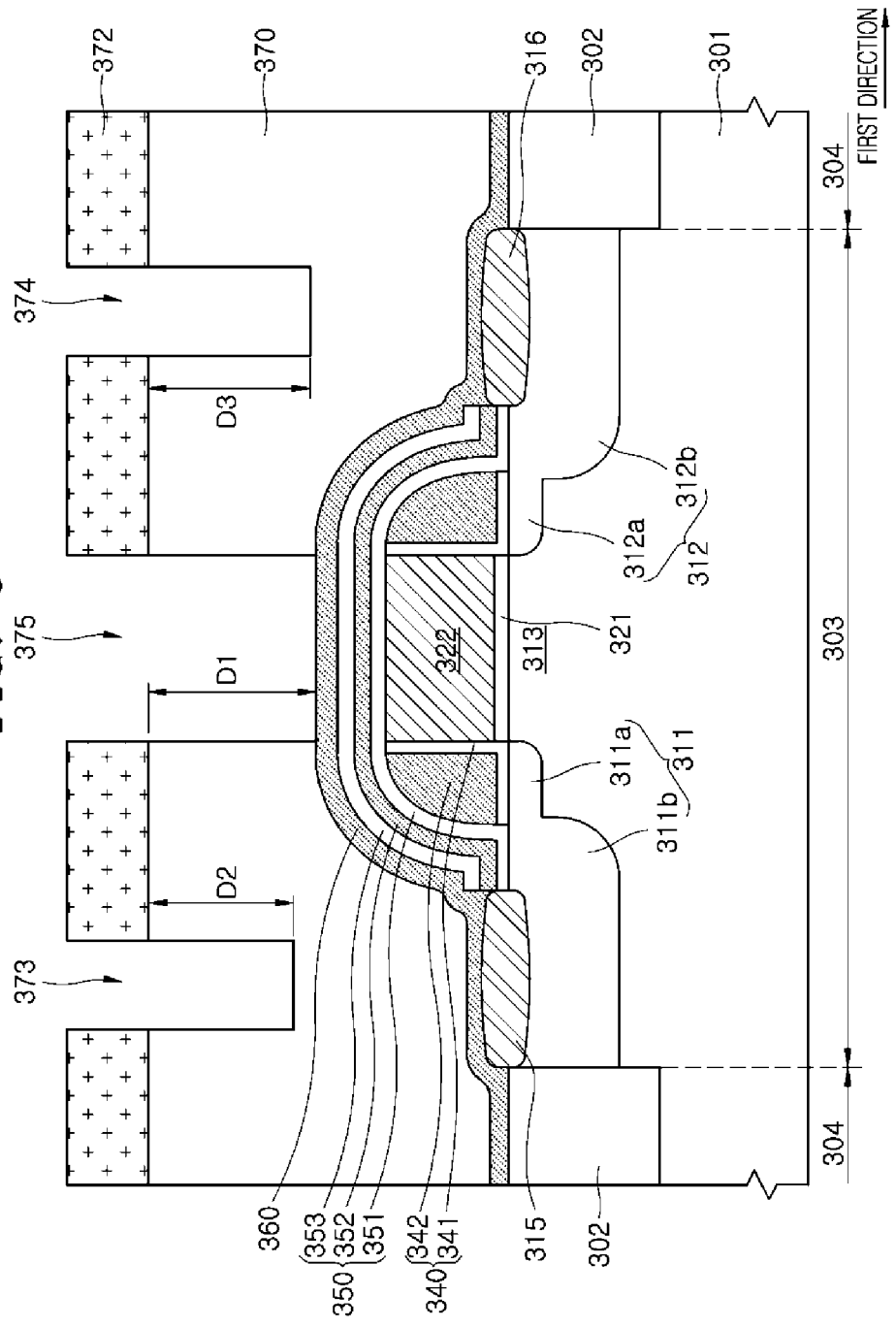

Referring to FIG. 9, an etch process may be applied to the exposed portions of the interlayer insulation layer 370. The etch process may be performed until the etch buffer layer 360 over the gate electrode pattern 322 is exposed. As a result, a first preliminary hole having a depth D1 may be formed over the gate electrode pattern 322, and a second preliminary hole having a depth D2 may be formed over the first silicide layer 315. In addition, a third preliminary hole having a depth D3 may be formed over the second silicide layer 316. In such a case, the depths D1, D2 and D3 may be substantially equal to each other.

Figure 10:
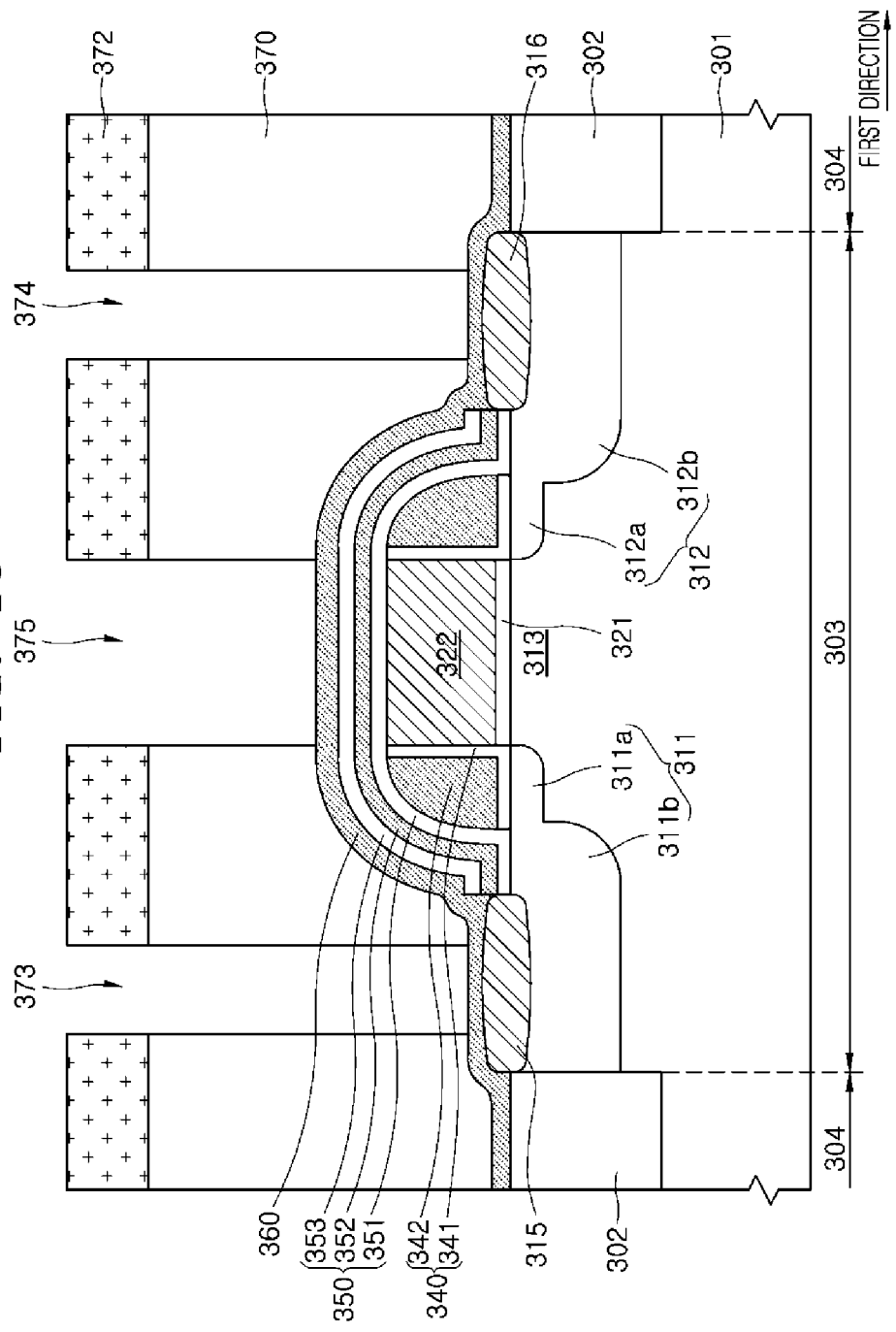

Referring to FIG. 10, the etch process may be continuously performed until the etch buffer layer 360 on the first and second silicide layers 315 and 316 is exposed. In such a case, since the etch buffer layer 360 serves as an etch stop layer, the first and second silicide layers 315 and 316 may not be exposed even though over-etch occurs during the etch process. Although not shown in FIG. 10, portions of the etch buffer layer 360 under the openings 373, 374 and 375 may be further etched to provide recessed regions during the etch process. A thickness of the etch buffer layer 360 remaining under the recessed regions may be determined by a ratio of etch rates of the interlayer insulation layer 370 and the etch buffer layer 360. Thus, if an etch selectivity of the etch buffer layer 360 to the interlayer insulation layer 370 is appropriately controlled, the etch buffer layer 360 remaining on the first and second silicide layers 315 and 316 and the gate electrode pattern 322 may have a sufficient thickness even after the etch process is performed.

Figure 11:
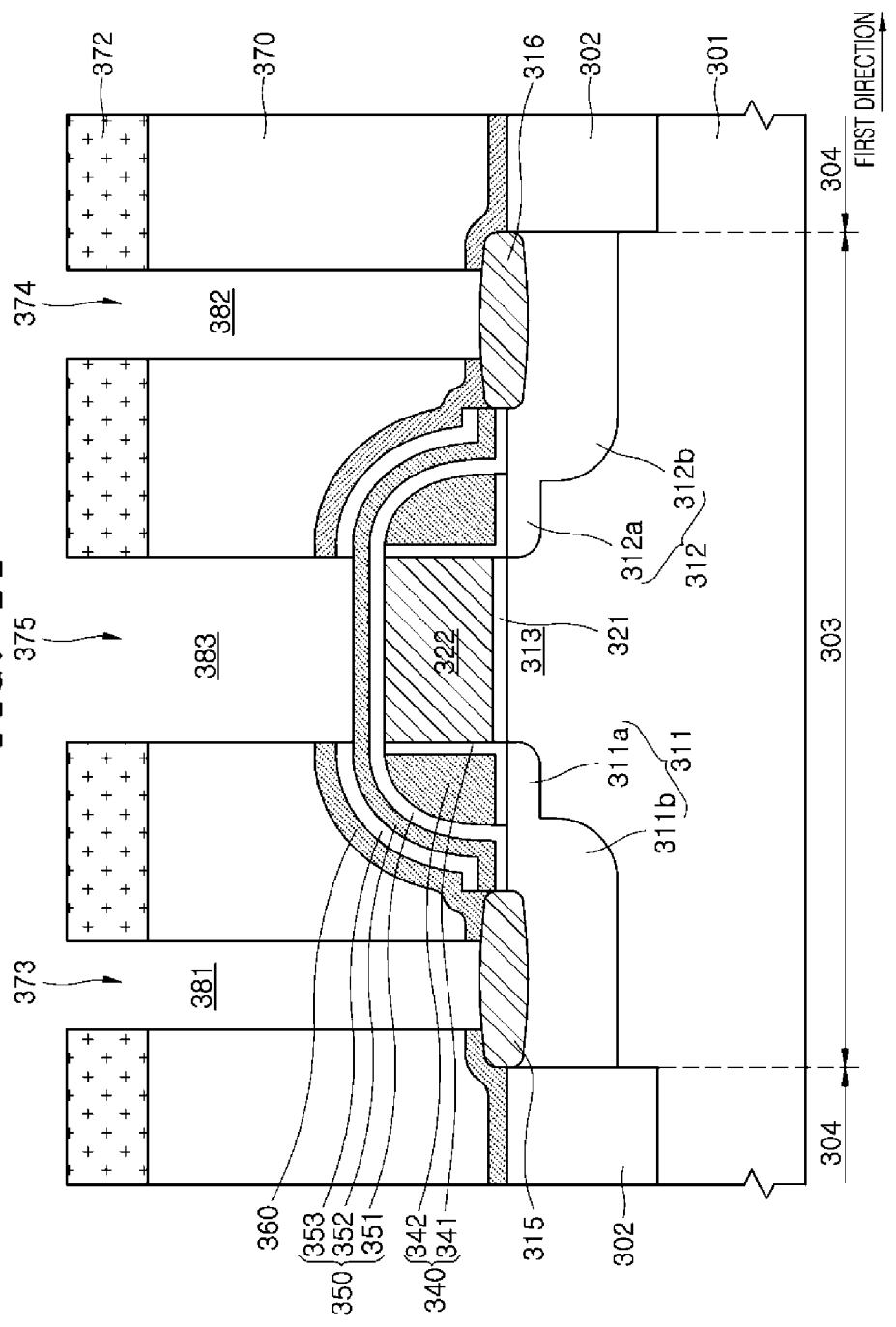

Referring to FIG. 11, an additional etch process may be performed to remove the exposed portions of the etch buffer layer 360 remaining on the first and second silicide layers 315 and 316 and the gate electrode pattern 322. As a result, a source contact hole 381 exposing the first silicide layer 315 and a drain contact hole 382 exposing the second silicide layer 316 may be formed. While the source contact hole 381 and the drain contact hole 382 are formed, a coupling contact hole 383 may also be formed over the gate electrode pattern 322. The coupling contact hole 383 may expose the third insulation layer 353 of the silicide blocking layer 350. The third insulation layer 353 over the gate electrode pattern 322 may be over-etched to provide a recessed region. Alternatively, the coupling contact hole 383 may be formed to penetrate the third insulation layer 353 of the silicide blocking layer 350 and to expose the second insulation layer 352 of the silicide blocking layer 350.

Figure 12:
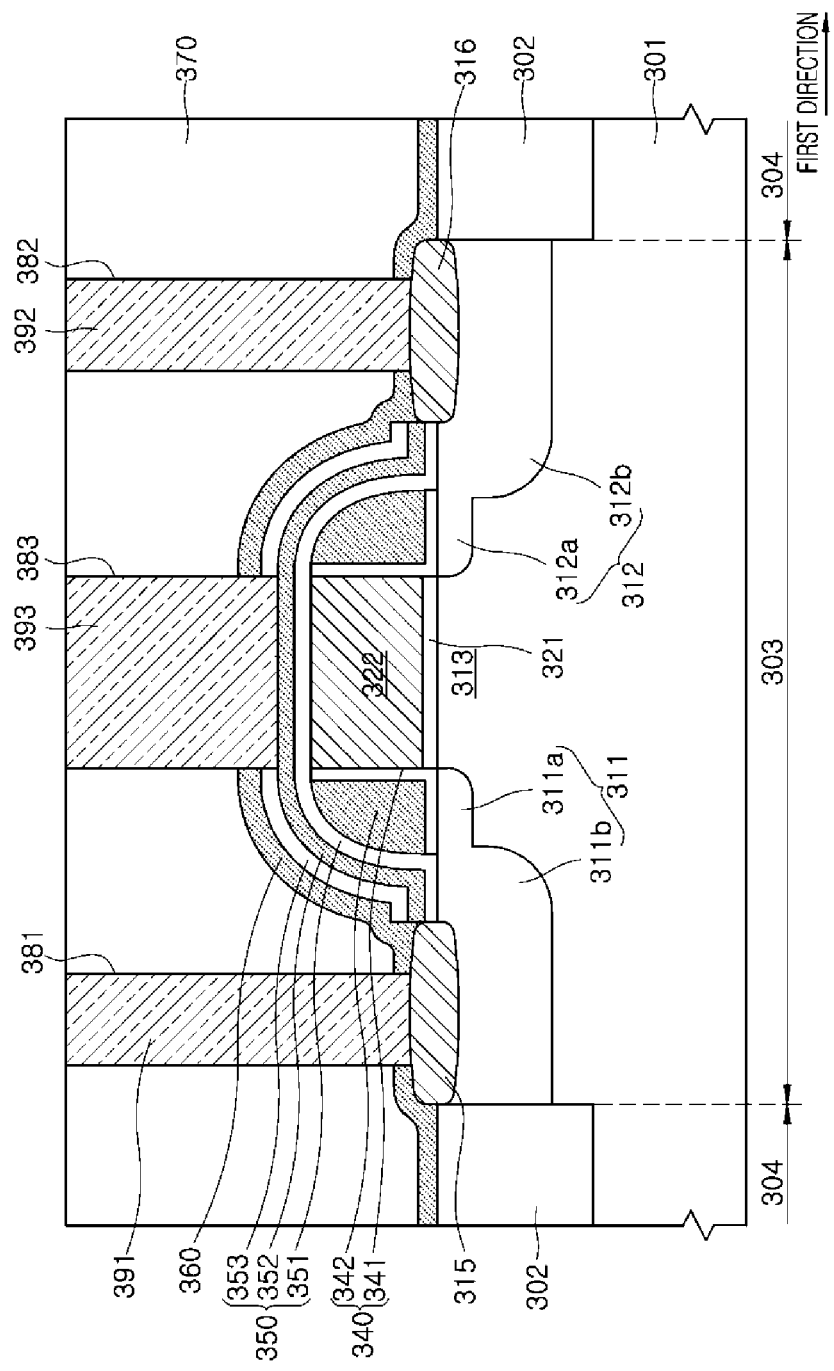

Referring to FIG. 12, a source contact plug 391, a drain contact plug 392 and a coupling contact plug 393 may be formed in the source contact hole 381, the drain contact hole 382 and the coupling contact hole 383, respectively. In some embodiments, the source contact plug 391, the drain contact plug 392 and the coupling contact plug 393 may be formed of a metal layer such as a tungsten (W) layer. A bottom surface of the source contact plug 391 may contact the first silicide layer 315. Thus, the source contact plug 391 may be electrically connected to the source region 311 through the first silicide layer 315. A bottom surface of the drain contact plug 392 may contact the second silicide layer 316. Thus, the drain contact plug 392 may be electrically connected to the drain region 312 through the second silicide layer 316. The coupling contact plug 393 may be spaced apart from the gate electrode pattern 322 by the first and second insulation layers 351 and 352 of the silicide blocking layer 350. Thus, the gate electrode pattern 322 may be electrically isolated and have a floated state. Accordingly, if a certain voltage is applied to the coupling contact plug 393, a coupling voltage may be induced at the gate electrode pattern 322.

Figure 13:
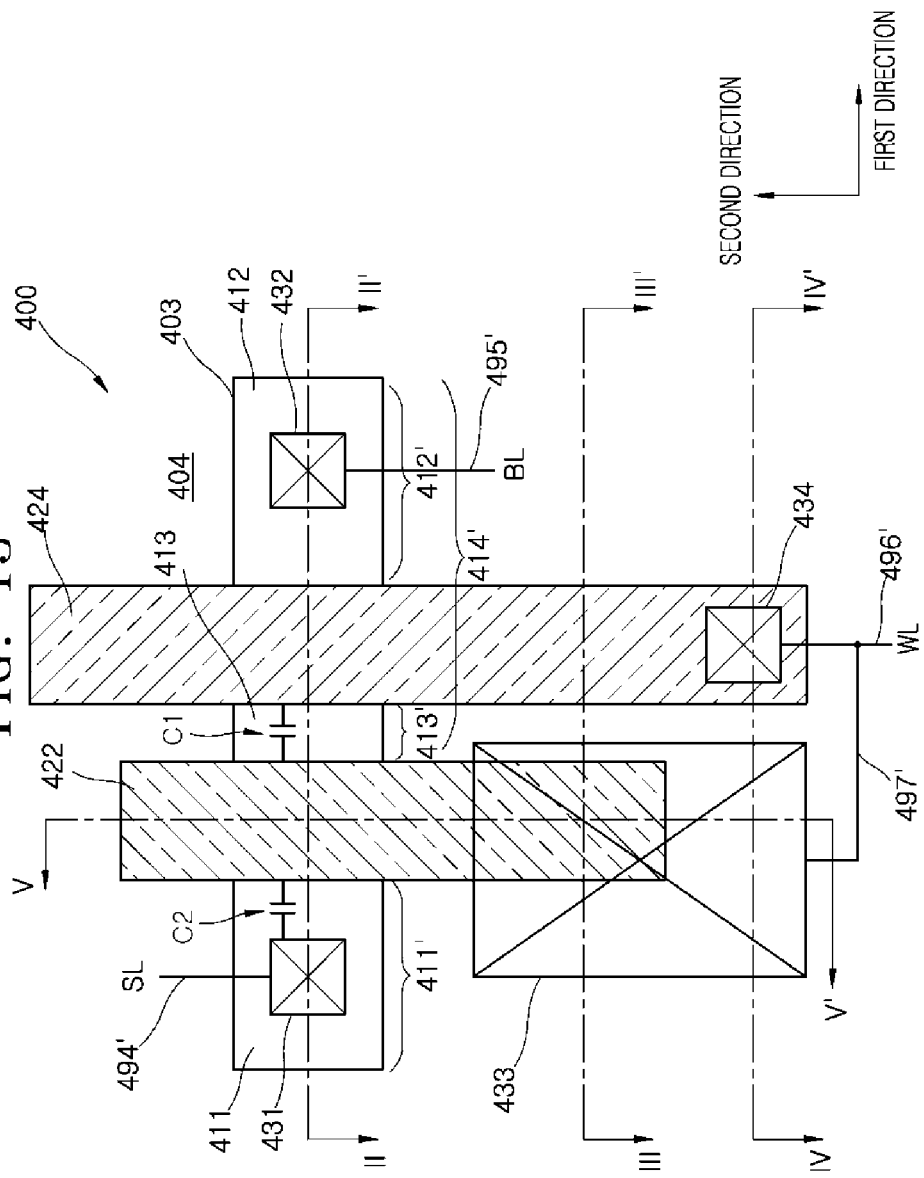
FIG. 13 is a plan view illustrating a nonvolatile memory device according to another embodiment.

FIG. 13 is a plan view illustrating a nonvolatile memory device 400 according to another embodiment. Referring to FIG. 13, the nonvolatile memory device 400 may include a storage transistor having a storage gate 422 and a selection transistor having a selection gate 424. Specifically, an active region 403 may be disposed to extend in a first direction, which corresponds to a horizontal direction in the drawing. The active region 403 may be defined by an isolation region 404. The storage gate 422 may be disposed to extend in a second direction, which corresponds to a vertical direction in the drawing. The storage gate 422 may be disposed to intersect the active region 403. Thus, the active region 403 may be divided into a left region 411' located at a left side of the storage gate 422 and a right region 414' located at a right side of the storage gate 422. Accordingly, the left region 411' and the right region 414' may be arrayed in the first direction and may be separated from each other by the storage gate 422. The selection gate 424 may be disposed to extend in the second direction. The selection gate 424 may be disposed to intersect the right region 414' of the active region 403. Thus, the right region 414' of the active region 403 may be divided into a central region 413' located between the selection gate 424 and the storage gate 422 and a right region 412' located at a right side of the selection gate 424. Accordingly, the central region 413' and the right region 412' may be arrayed in the first direction and may be separated from each other by the selection gate 424.

A left sidewall of the selection gate 424 adjacent to the central region 413' may face a right sidewall of the storage gate 422 adjacent to the central region 413'. Although not shown in FIG. 13, an insulation layer having a certain dielectric constant may be disposed between the left sidewall of the selection gate 424 and the right sidewall of the storage gate 422. Thus, the storage gate 422, the selection gate 424, and the insulation layer between the storage gate 422 and the selection gate 424 may constitute a first coupling capacitor C1. If a voltage is applied to the selection gate 424, a coupling voltage may be induced at the storage gate 422 due to the first coupling capacitor C1.

A first junction region 411 may be disposed in the left region 411' of the active region 403. A second junction region 412 may be disposed in the right region 412' of the active region 403. A third junction region 413 may be disposed in the central region 413' of the active region 403. In some embodiments, the first, second and third junction regions 411, 412 and 413 may be N-type impurity regions. The first and third junction regions 411 and 413 may serve as a source region and a drain region of the storage transistor, respectively. The third and second junction regions 413 and 412 may serve as a source region and a drain region of the selection transistor, respectively. The storage transistor may share the third junction region 413 with the selection transistor. Thus, the third junction region 413 may serve as the drain region of the storage transistor and may serve as the source region of the selection transistor. If the selection transistor is turned on, a voltage applied to the second junction region 412 may be transmitted to the third junction region 413.

A first contact 431 may be disposed on the first junction region 411. The first contact 431 may include a source contact plug. The source contact plug may directly contact the first junction region 411 or may be electrically connected to the first junction region 411 through a conductive layer such as a silicide layer. The first contact 431 may be electrically connected to a source line SL through an interconnection line 494'. A second contact 432 may be disposed on the second junction region 412. The second contact 432 may include a drain contact plug. The drain contact plug may directly contact the second junction region 412 or may be electrically connected to the second junction region 412 through a conductive layer such as a silicide layer. The second contact 432 may be electrically connected to a bit line BL through an interconnection line 495'. A third contact 433 may be disposed on a portion of the storage gate 422 that does not overlap with the active region 403. The third contact 433 may include a coupling contact plug. The coupling contact plug may not physically contact the storage gate 422. Thus, the storage gate 422 may be electrically floated. A fourth contact 434 may be disposed on the selection gate 424. The fourth contact 434 may be electrically connected to a word line WL through an interconnection line 496'. The interconnection line 496' may be electrically connected to the third contact 433 through an interconnection line 497'. Thus, the interconnection lines 496' and 497' may electrically connect the third contact 433 to the fourth contact 434.

Although not shown in FIG. 13, an insulation layer having a certain dielectric constant may be disposed between the storage gate 422 and the first contact 431, which corresponds to the source contact plug. Thus, the storage gate 422, the first contact 431 that is, the source contact plug, and the insulation layer between the storage gate 422 and the first contact 431 may constitute a second coupling capacitor C2. If a voltage is applied to the source contact plug, a coupling voltage may be induced at the storage gate 422 due to the second coupling capacitor C2. In addition, although not shown in the plan view of FIG. 13, an insulation layer having a certain dielectric constant may be disposed between the storage gate 422 and the third contact 433, which corresponds to the coupling contact plug. Thus, the storage gate 422, the third contact 433 that is, the coupling contact plug, and the insulation layer between the storage gate 422 and the third contact 433 may constitute a third coupling capacitor. A detailed description of the third coupling capacitor will be developed hereinafter with reference to a cross-sectional view of FIG. 14.

Figure 14:
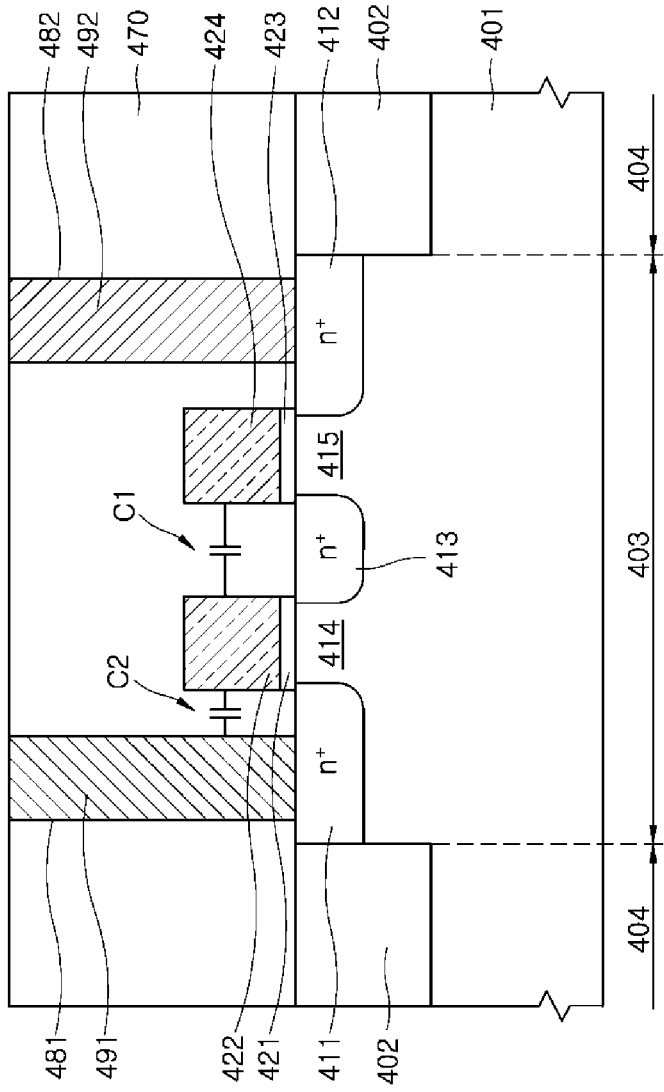
FIG. 14 is a cross-sectional view taken along a line II-II' of FIG. 13.
Figure 15:
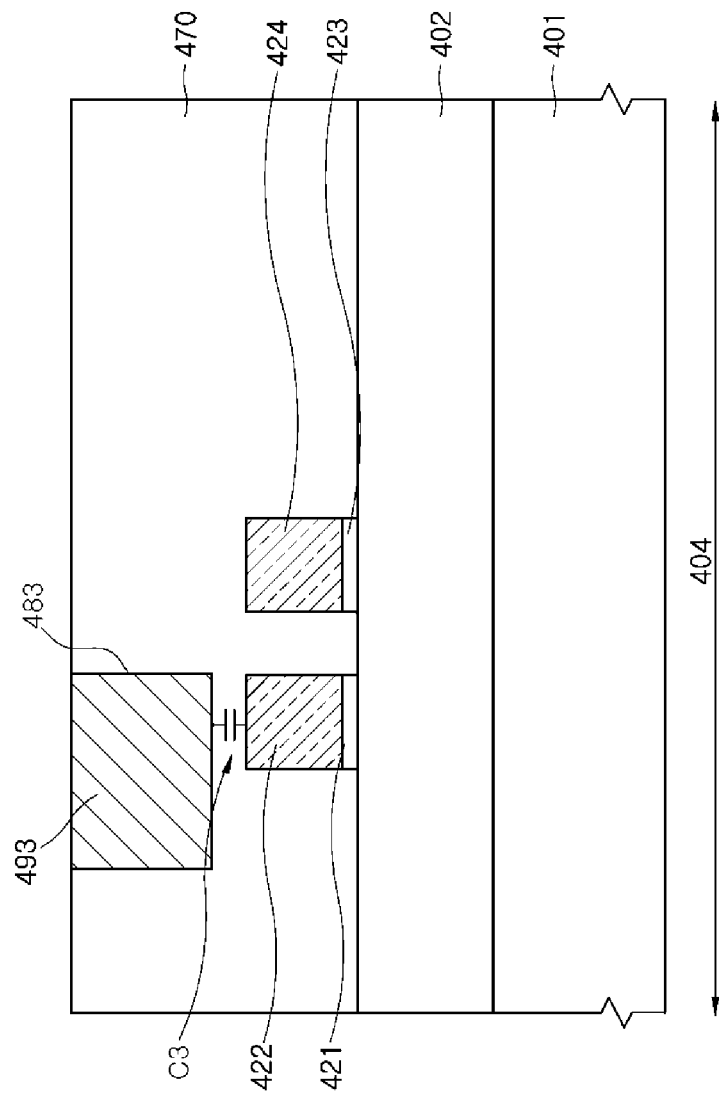
FIG. 15 is a cross-sectional view taken along a line III-III' of FIG. 13.
Figure 16:
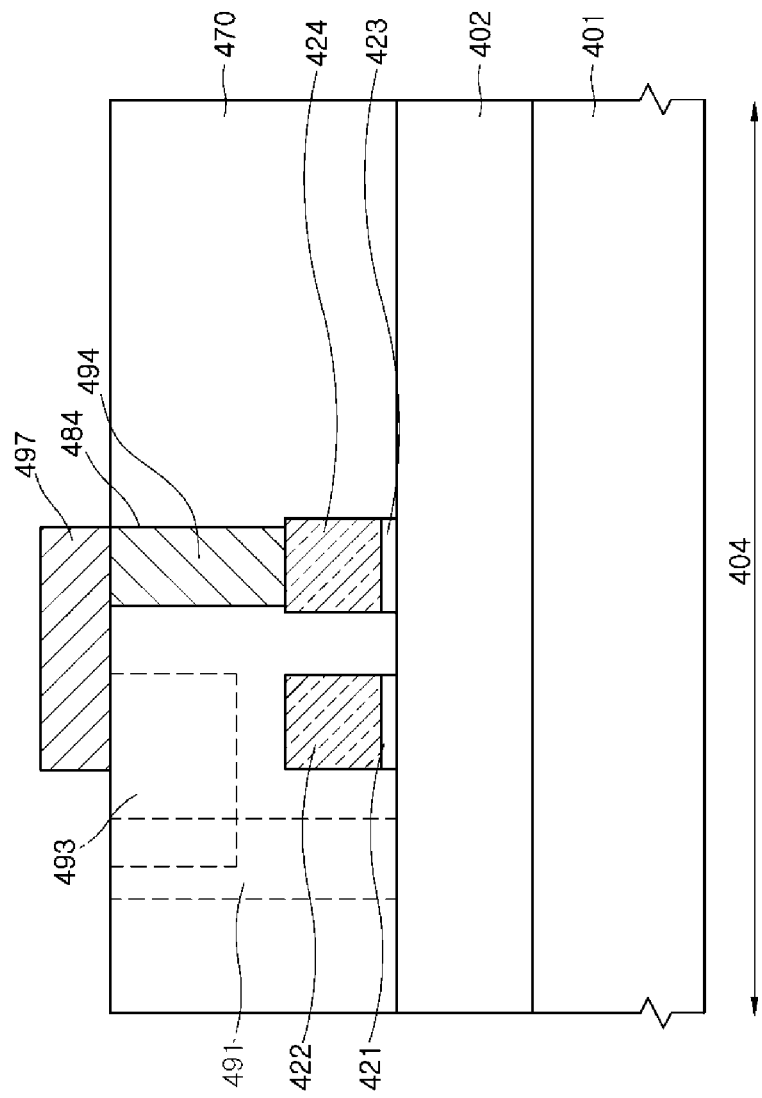
FIG. 16 is a cross-sectional view taken along a line IV-IV' of FIG. 13.
Figure 17:
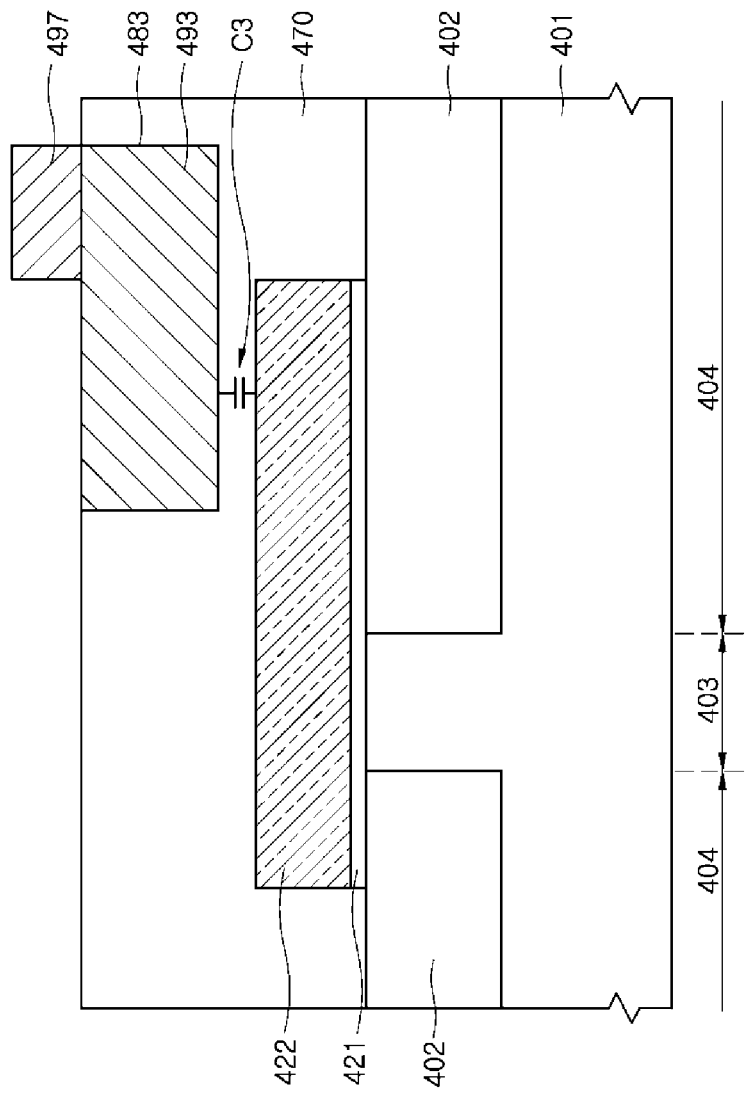
FIG. 17 is a cross-sectional view taken along a line V-V' of FIG. 13.

FIG. 14 is a cross-sectional view taken along a line II-II' of FIG. 13. FIG. 15 is a cross-sectional view taken along a line III-III' of FIG. 13. FIG. 16 is a cross-sectional view taken along a line IV-IV' of FIG. 13. FIG. 17 is a cross-sectional view taken along a line V-V' of FIG. 13. Referring to FIGS. 14, 15, 16 and 17, an isolation layer 402 may be disposed in the isolation region 404 of a substrate 401. The isolation layer 402 may be a trench isolation layer. However, the isolation layer 402 is not limited to a trench isolation layer. The isolation layer 402 may define the active region 403 in the substrate 401. That is, an upper portion of the substrate 401 surrounded by the isolation layer 402 may be defined as the active region 403. The active region 403 may include the first junction region 411, the second junction region 412 and the third junction region 413. The third junction region 413 may be disposed between the first and second junction regions 411 and 412. The active region 403 between the first and third junction regions 411 and 413 may be defined as a first channel region 414. The active region 403 between the second and third junction regions 412 and 413 may be defined as a second channel region 415. Although not shown in the cross-sectional view of FIG. 14, each of the first, second and third junction regions 411, 412 and 413 may have an LDD structure as illustrated in FIG. 2. In such a case, an insulation spacer may be disposed on sidewalls of the storage gate 422 and the selection gate 424.

The storage gate 422 may be disposed on the first channel region 414, and a first gate insulation pattern 421 may be disposed between the storage gate 422 and the first channel region 414. The selection gate 424 may be disposed on the second channel region 415, and a second gate insulation pattern 423 may be disposed between the selection gate 424 and the second channel region 415. In some embodiments, the storage gate 422 and the selection gate 424 may be formed of the same polysilicon layer. In some other embodiments, the storage gate 422 and the selection gate 424 may be formed of the same conductive layer other than a polysilicon layer.

An interlayer insulation layer 470 may be disposed on the substrate 401 to cover the isolation layer 402, the active region 403, the storage gate 422 and the selection gate 424. The interlayer insulation layer 470 may include a first contact hole 481, a second contact hole 482, a third contact hole 483 and a fourth contact hole 484 therein. The first and second contact holes 481 and 482 may vertically overlap with the first and second junction regions 411 and 412, respectively. The third contact hole 483 may vertically overlap with a portion of the storage gate 422. The fourth contact hole 484 may vertically overlap with a portion of the selection gate 424. As illustrated in FIG. 14, the first and second contact holes 481 and 482 may expose the first and second junction regions 411 and 412, respectively. In addition, as illustrated in FIG. 16, the fourth contact hole 484 may expose the selection gate 424. In contrast, as illustrated in FIG. 15, the third contact hole 483 may not expose the storage gate 422.

A source contact plug 491 may fill the first contact hole 481 to contact the first junction region 411. Although not shown in the drawings, in another embodiment, a silicide layer may be disposed on the first junction region 411. In such a case, the source contact plug 491 may contact the silicide layer on the first junction region 411. A drain contact plug 492 may fill the second contact hole 482 to contact the second junction region 412. Although not shown in the drawings, in another embodiment, a silicide layer may be disposed on the second junction region 412. In such a case, the drain contact plug 492 may contact the silicide layer on the second junction region 412. A coupling contact plug 493 may fill the third contact hole 483 and may be separated from the storage gate 422 by the interlayer insulation layer 470. A selection gate contact plug 494 may fill the fourth contact hole 484 to contact the selection gate 424. Although not shown in the drawings, in another embodiment, a silicide layer may be disposed on the selection gate 424. In such a case, the selection gate contact plug 494 may contact the silicide layer on the selection gate 424. The source contact plug 491, the drain contact plug 492, the coupling contact plug 493 and the selection gate contact plug 494 may correspond to the first, second, third and fourth contacts 431, 432, 433 and 434 described with reference to FIG. 13, respectively.

As illustrated in FIGS. 16 and 17, the coupling contact plug 493 may be electrically connected to the selection gate contact plug 494 through a metal interconnection line 497. The metal interconnection line 497 may correspond to the interconnection line 497' described with reference to FIG. 13. The metal interconnection line 497 may be disposed on the interlayer insulation layer 470 to contact both of the coupling contact plug 493 and the selection gate contact plug 494. Although the source contact plug 491 and the coupling contact plug 493 are not actually shown in the cross-sectional view of FIG. 16 taken along the line IV-IV' of FIG. 13, the source contact plug 491 and the coupling contact plug 493 are illustrated by dotted lines to better understand the embodiments. If a voltage is applied to the selection gate 424 through the metal interconnection line 497 and the selection gate contact plug 494, the voltage applied to the selection gate 424 may also be transmitted to the coupling contact plug 493 through the metal interconnection line 497.

In the nonvolatile memory device ("NVM") 400 according to the present embodiment, a coupling voltage induced at the storage gate 422 may be generated due to at least the three coupling capacitors. These coupling capacitors may be comprised of the contact plugs and the selection gate. Thus, it may be unnecessary to form a MOS capacitor having a certain planar area in the substrate 401 to induce a coupling voltage of the storage gate 422. As a result, a planar area occupied by the NVM device 400 does not increase. In addition, the storage transistor and the selection transistor may be a single polysilicon layer. Accordingly, the NVM device 400 may be provided using a CMOS compatible process.

Specifically, as illustrated in FIG. 14, the storage gate 422, the selection gate 424, and the interlayer insulation layer 470 between the storage gate 422 and the selection gate 424 may constitute the first coupling capacitor C1. Insulation spaces may be disposed on the sidewalls of the storage gate 422 and the selection gate 424. In such a case, the insulation spacer and the interlayer insulation layer 470 disposed between the storage gate 422 and the selection gate 424 may serve as a dielectric layer of the first coupling capacitor C1. The source contact plug 491, the storage gate 422, and the interlayer insulation layer 470 between the source contact plug 491 and the storage gate 422 may constitute the second coupling capacitor C2. Insulation spacers may be disposed on the sidewalls of the storage gate 422. In such a case, the insulation spacer and the interlayer insulation layer 470 disposed between the source contact plug 491 and the storage gate 422 may serve as a dielectric layer of the second coupling capacitor C2. As illustrated in FIG. 15, the storage gate 422, the coupling contact plug 493, and the interlayer insulation layer 470 between the storage gate 422 and the coupling contact plug 493 may constitute a third coupling capacitor C3. Accordingly, a coupling voltage may be induced at the storage gate 422 due to a combination of the first, second and third coupling capacitors C1, C2 and C3.

Figure 18:
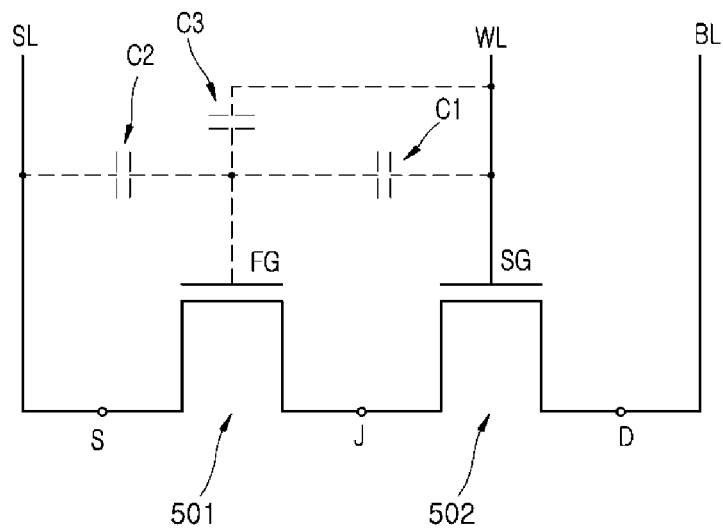
FIG. 18 illustrates an equivalent circuit diagram of the nonvolatile memory device shown in FIGS. 13 to 17.

FIG. 18 illustrates an equivalent circuit diagram of the nonvolatile memory device 400 shown in FIGS. 13 to 17. Referring to FIG. 18, the nonvolatile memory device 400 may include a storage transistor 501 and a selection transistor 502 which are connected in series, and the storage transistor 501 may share a joint terminal J with the selection transistor 502. The storage transistor 501 may have a floating gate terminal FG, a source terminal S and the joint terminal J. The floating gate terminal FG, the source terminal S and the joint terminal J may correspond to the storage gate 422, the first junction region 411 and the third junction region 413 which are illustrated in FIGS. 13 to 17, respectively. The selection transistor 502 may have a selection gate terminal SG, the joint terminal J and a drain terminal D. The selection gate terminal SG, the joint terminal J and the drain terminal D may correspond to the selection gate 424, the third junction region 413 and the second junction region 412 which are illustrated in FIGS. 13 to 17, respectively. The source terminal S of the storage transistor 501 may be connected to the source line SL through the source contact plug (491 of FIG. 14). The drain terminal D of the selection transistor 502 may be connected to the bit line BL through the drain contact plug (492 of FIG. 14). The selection gate terminal SG of the selection transistor 502 may be connected to both of the word line WL and the coupling contact plug (493 of FIG. 15) through the selection gate contact plug (494 of FIG. 16).

As described with reference to FIG. 14, the selection gate 424, the storage gate 422, and the interlayer insulation layer 470 between the selection gate 424 and the storage gate 422 may constitute the first coupling capacitor C1, and the first coupling capacitor C1 is between the selection gate terminal SG and the floating gate terminal FG in FIG. 18. Similarly, the source contact plug 491, the storage gate 422, and the interlayer insulation layer 470 between the source contact plug 491 and the storage gate 422 may constitute the second coupling capacitor C2, and the second coupling capacitor C2 is between the source terminal S and the floating gate terminal FG in FIG. 18. As described with reference to FIG. 15, the storage gate 422, the coupling contact plug 493, and the interlayer insulation layer 470 between the storage gate 422 and the coupling contact plug 493 may constitute the third coupling capacitor C3, and the third coupling capacitor C3 is between the floating gate terminal FG and the interconnection line connecting the selection gate terminal SG to the word line WL in FIG. 18. The first, second and third coupling capacitors C1, C2 and C3 may correspond to parasitic passive elements which are provided without additional fabrication processes. Thus, the first, second and third coupling capacitors C1, C2 and C3 are illustrated by dotted lines in the equivalent circuit diagram of FIG. 18.

To execute a program operation, a ground voltage may be applied to the bit line BL, and a selection voltage Vsel and a source voltage Vsl may be applied to the word line WL and the source line SL, respectively. The selection voltage Vsel and the source voltage Vsl may be positive voltages. The selection voltage Vsel may be higher than a threshold voltage of the selection transistor 502. In an embodiment, when the selection voltage Vsel is applied to the word line WL, the selection transistor 502 may be turned on. Thus, a ground voltage applied to the bit line BL may be transmitted to the joint terminal J. If a voltage drop is neglected in each element, the source voltage Vsl may be directly applied between the source terminal S and the joint terminal J. As a result, a lateral electric field may be created between the source terminal S and the joint terminal J. Moreover, when the selection voltage Vsel is applied to the selection gate terminal SG through the word line WL, a coupling voltage may be induced at the floating gate terminal FG due to the first and third coupling capacitors C1 and C3. In addition, when the source voltage Vsl is applied to the source terminal S through the source line SL, the coupling voltage induced at the floating gate terminal FG may vary due to the second coupling capacitor C2. That is, the coupling voltage induced at the floating gate terminal FG may be determined by a combination of the first, second and third coupling capacitors C1, C2 and C3 which are connected in parallel to each other. When the coupling voltage is induced at the floating gate terminal FG, a strong vertical electric field may be created between the floating gate terminal FG and a source-side channel region of the storage transistor 501. In such a case, hot carriers may be generated in the source-side channel region of the storage transistor 501 by the lateral electric field created between the source terminal S and the joint terminal J, and the hot carriers for example, hot electrons generated in the source-side channel region may be injected into the floating gate terminal FG by the vertical electric field between floating gate terminal FG and the source-side channel region. As a result, the NVM device that is, an NVM cell of FIG. 18 may be programmed.

To execute an erasure operation, a ground voltage may be applied to the bit line BL, and a selection voltage Vsel and a source voltage Vsl may be applied to the word line WL and the source line SL, respectively. The selection voltage Vsel may be a negative voltage and the source voltage Vsl may be positive voltage. Under the above bias condition, the negative selection voltage Vsel may be applied to the selection gate terminal SG through the word line WL. Thus, a coupling voltage may be induced at the floating gate terminal FG due to the first and third coupling capacitors C1 and C3. In such a case, the coupling voltage induced at the floating gate terminal FG may have a negative voltage level. In addition, since the source voltage Vsl is applied to the source terminal S through the source line SL, the coupling voltage induced at the floating gate terminal FG may vary due to the second coupling capacitor C2. The source voltage Vsl and a capacitance value of the second coupling capacitor C2 may be set so that a final coupling voltage induced at the floating gate terminal FG has a negative voltage level. In such a case, charges for example, electrons stored in the floating gate terminal FG may be injected into the source terminal S by a band to band tunneling (BTBT) mechanism. As a result, the NVM device that is, an NVM cell of FIG. 18 may be erased.

To execute a read operation, a ground voltage may be applied to the bit line BL, and a selection voltage Vsel and a source voltage Vsl may be applied to the word line WL and the source line SL, respectively. The selection voltage Vsel and the source voltage Vsl may be positive voltages. The selection voltage Vsel may be higher than a threshold voltage of the selection transistor 502. The source voltage Vsl used in the read operation may be lower than the source voltage Vsl used in the program operation. This is for lowering a coupling voltage induced at the floating gate terminal FG to prevent the storage transistor 501 from being programmed in the read operation. When the selection voltage Vsel is applied to the selection gate terminal SG through the word line WL, a coupling voltage may be induced at the floating gate terminal FG due to the first and third coupling capacitors C1 and C3. In addition, when the source voltage Vsl is applied to the source terminal S through the source line SL, the coupling voltage induced at the floating gate terminal FG may vary due to the second coupling capacitor C2. That is, after the selection voltage Vsel and the source voltage Vsl are respectively applied to the selection gate terminal SG and the source terminal S, a final coupling voltage may be induced at the floating gate terminal FG. When the storage transistor 501 has a programmed state, a threshold voltage of the storage transistor 501 may be higher than the final coupling voltage induced at the floating gate terminal FG. Thus, the storage transistor 501 may be turned off, and no current may flow through the source line SL and the bit line BL. In contrast, when the storage transistor 501 has an erased state, a threshold voltage of the storage transistor 501 may be lower than the final coupling voltage induced at the floating gate terminal FG. Thus, the storage transistor 501 may be turned on, and current may flow through the source line SL and the bit line BL. A sense amplifier (not shown) connected to the bit line BL may sense the bit line current and determine whether the storage transistor 501 has a programmed state or an erased state and to output a data signal having a logic "high" level or a logic "low" level.

What is claimed is:

1. A nonvolatile memory device comprising:
    a plurality of active regions disposed in a plurality of rows, each active region corresponding to a respective row of the plurality of rows;
    a plurality of gate electrode patterns disposed in a plurality of columns, each of the plurality of gate electrode patterns being disposed at a respective cross point of one of the plurality of rows and one of the plurality of columns;
    source regions and drain regions disposed in the active region and located at both sides of each of the gate electrode patterns;
    source contact plugs respectively disposed over the source regions;
    drain contact plugs respectively disposed over the drain regions;
    a plurality of coupling contact plugs respectively extending in the plurality of columns, each of the coupling contact plugs overlapping with the gate electrode patterns;
    an insulation layer disposed between the coupling contact plugs and the gate electrode patterns; and
    an interlayer insulation layer disposed over the insulation layer,
    wherein the source contact plugs, the drain contact plugs, and the plurality of coupling contact plugs are penetrated through the interlayer insulation layer,
    wherein the source contact plugs disposed between two neighboring columns are electrically connected to a single source line;
    wherein the drain contact plugs disposed in the same row are electrically connected to a single bit line;
    wherein the coupling contact plug disposed in each column is electrically connected to a single word line; and
    wherein top surfaces of the source contact plugs, the drain contact plugs and the coupling contact plugs are exposed at a top surface of the interlayer insulation layer and coplanar with the top surface of the interlayer insulation layer.

2. The nonvolatile memory device of claim 1, wherein each of the gate electrode patterns is formed of a single polysilicon layer.

3. The nonvolatile memory device of claim 1, wherein the source contact plugs, the drain contact plugs, and the coupling contact plugs include the same conductive material.

4. The nonvolatile memory device of claim 3, wherein the same conductive material includes a tungsten material.

5. The nonvolatile memory device of claim 1, wherein the insulation layer is a silicide blocking layer having a multi-layered structure.

6. The nonvolatile memory device of claim 5, wherein the silicide blocking layer includes a first insulation layer, a second insulation layer, and a third insulation layer which are sequentially stacked.

* * * * *